United States Patent
Richter

(10) Patent No.: US 11,308,017 B2
(45) Date of Patent: Apr. 19, 2022

(54) RECONFIGURABLE CHANNEL INTERFACES FOR MEMORY DEVICES

(71) Applicant: Micron Technology, Inc., Boise, ID (US)

(72) Inventor: Michael Dieter Richter, Ottobrunn (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/858,286

(22) Filed: Apr. 24, 2020

(65) Prior Publication Data
US 2020/0379936 A1 Dec. 3, 2020

Related U.S. Application Data

(60) Provisional application No. 62/855,305, filed on May 31, 2019.

(51) Int. Cl.
*G06F 13/16* (2006.01)
*G06F 13/40* (2006.01)

(52) U.S. Cl.
CPC ...... *G06F 13/4027* (2013.01); *G06F 13/1668* (2013.01)

(58) Field of Classification Search
None
See application file for complete search history.

(56) References Cited

U.S. PATENT DOCUMENTS

| | | | |
|---|---|---|---|
| 7,406,572 B1* | 7/2008 | Nguyen | G06F 13/1694 711/107 |
| 10,884,951 B2* | 1/2021 | Morrison | G11C 16/22 |
| 2004/0186956 A1* | 9/2004 | Perego | G11C 29/028 711/115 |
| 2008/0089139 A1* | 4/2008 | Ong | G11C 29/023 365/189.08 |
| 2013/0194854 A1* | 8/2013 | Shaeffer | G11C 5/04 365/63 |
| 2014/0192583 A1* | 7/2014 | Rajan | G11C 5/06 365/63 |
| 2014/0297939 A1* | 10/2014 | Perego | G11C 7/1072 711/105 |

(Continued)

OTHER PUBLICATIONS

ISA/KR, International Search Report and Written Opinion of the International Searching Authority, Int'l Appl. No. PCT/US2020/030099, dated Aug. 7, 2020, Korean Intellectual Property Office, Seo-gu, Daejeon, Republic of Korea, 15 pgs.

*Primary Examiner* — Michael Sun
(74) *Attorney, Agent, or Firm* — Holland & Hart LLP

(57) ABSTRACT

Methods, systems, and devices for reconfigurable channel interfaces for memory devices are described. A memory device may be split into multiple logical channels, where each logical channel is associated with a memory array and a command/address (CA) interface. In some cases, the memory device may configure a first CA interface associated with a first channel to forward commands to a first memory array associated with the first channel and a second memory array associated with a second channel. The configuring may include isolating a second CA interface associated with the second channel from the second array and coupling the first CA interface with the second memory array.

35 Claims, 12 Drawing Sheets

(56) References Cited

U.S. PATENT DOCUMENTS

| | | | |
|---|---|---|---|
| 2015/0106560 A1* | 4/2015 | Perego | G06F 12/0246 |
| | | | 711/105 |
| 2016/0117251 A1* | 4/2016 | Lin | G06F 3/0613 |
| | | | 711/129 |
| 2016/0181214 A1 | 6/2016 | Oh et al. | |
| 2017/0236566 A1 | 8/2017 | Nukala et al. | |
| 2017/0330610 A1 | 11/2017 | Ware et al. | |
| 2018/0090187 A1* | 3/2018 | Best | G11C 5/04 |

* cited by examiner

RECONFIGURABLE CHANNEL INTERFACES FOR MEMORY DEVICES

CROSS REFERENCE

The present Application for Patent claims the benefit of U.S. Provisional Patent Application No. 62/855,305 by RICHTER et al., entitled "RECONFIGURABLE CHANNEL INTERFACES FOR MEMORY DEVICES," filed May 31, 2019, assigned to the assignee hereof, and expressly incorporated by reference herein.

BACKGROUND

The following relates generally to a system that includes at least one memory device and more specifically to reconfigurable channel interfaces for memory devices.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

In some cases, a host device may transmit a read command or a write command to a memory device. If the memory device receives a read command, the memory device may decode the read command and may transmit a corresponding set of data to the host device over a data channel. If the memory device receives a write command, the memory device may decode the write command and may receive a corresponding set of data from the host device over a data channel.

DETAILED DESCRIPTION

Figure 1:
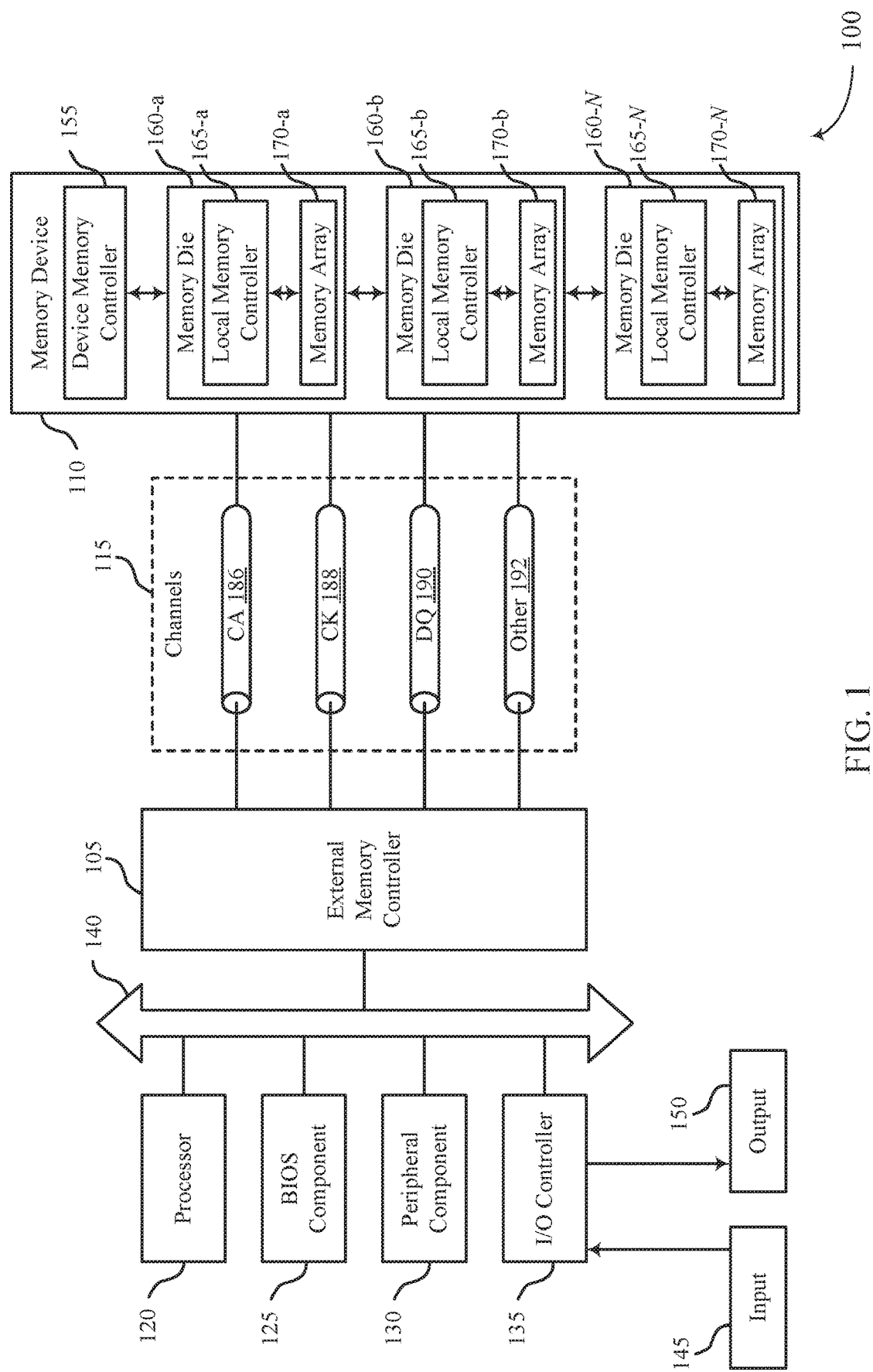
FIG. 1 illustrates an example of a system that supports reconfigurable channel interfaces for memory devices in accordance with examples as disclosed herein.

In general, the architecture of a memory device, for example a dynamic random access memory (DRAM) device, may have a predefined access granularity, where access granularity may refer to a quantity of bits or bytes that are written or read by a single access operation. A memory device may be split into multiple logical channels. Each logical channel may be associated with a memory array with a predefined access granularity. Each logical channel may be accessed in parallel. As such, if a write or read command is sent over multiple logical channels, memory arrays from each of the multiple logical channels may write or read data in parallel and may have a higher effective granularity. For instance, each memory array of a memory device may have an access granularity of thirty-two (32) bytes. If a read or write command is sent over two logical channels, a memory array from the first logical channel may read or write 32 bytes and a memory array from the second logical channel may read or write 32 bytes. As such, even though each individual memory array may read or write 32 bytes, both memory arrays together may read or write sixty-four (64) bytes for a given command.

Although splitting the memory device may enable an effectively increased access granularity, splitting the memory device may also increase pin overhead associated with operating the device (e.g., from fifteen (15) to twenty-four (24) pins). For instance, each logical channel may be associated with a command/address (CA) interface that is used to control a data interface of the logical channel. Each CA interface may be associated with a predefined quantity of pins. As such, increasing the quantity of logical channels may accordingly increase the quantity of pins.

The memory device may include reconfigurable CA interfaces such that the memory device may be configured to use a quantity of CA interfaces that is less than a total quantity of logical channels. For instance, a single CA interface may be used to control data interfaces for one or more channels other than the channel associated with the single CA interface. Configuring the single CA interface for this purpose may involve coupling the CA interface with a data interface for another channel. Additionally, configuring may involve isolating the CA interface for that channel from the data interface.

Features of the disclosure are initially described in the context of a memory system and memory die as described with reference to FIGS. 1 and 2. Features of the disclosure are described in the context of channel configurations of memory devices, a flow diagram, and routing schemes as described with reference to FIGS. 3A-6B. These and other features of the disclosure are further illustrated by and described with reference to apparatus diagrams and flowcharts that relate to reconfigurable channel interfaces for memory devices as described with references to FIGS. 7-11.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an Internet-connected device, some other stationary or portable electronic device, a graphic processing unit (GPU), or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a GPU, a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 (e.g., the host device or a component thereof) and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to communicate address and command data (e.g., eight or nine signal paths). In general, the CA channel 186 may be coupled with a CA interface, which may forward commands communicated by the CA channel 186 to a local memory controller 165 controlling a memory array 170 or directly to the memory array 170.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential signal (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like). There may be a CK channel 188 for each logical channel.

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. In some cases, a data channel 190 may be coupled with a memory array 170.

In some cases, a data channel 190 and an associated CA channel 186 may be an example of a logical channel. If the memory device 110 is split into logical channels, the memory device 110 may have multiple data channels 190 and multiple CA channels 186. Each data channel 190 may be coupled with a memory array 170 and each CA channel 186 may be coupled with a CA interface. In some cases, a CA interface associated with a first CA channel 186 and a first data channel 190 may gain control of a second data channel 190. Additionally, a CA interface associated with a second CA channel 186 and the second data channel 190 may be deactivated or may otherwise lose control of the second data channel 190. Gaining or losing control of a data channel 190 may involve coupling or decoupling, respectively, a CA interface from a memory array 170 coupled with the data channel 190.

In some cases, a CA interface may receive a command (e.g., a read or write command) over an associated CA channel 186. If the CA interface is associated with multiple data channels 190, the CA interface may forward the command to memory arrays 170 coupled with the multiple data channels 190. If the command is a read command, a first memory array 170 receiving the command may transmit a first set of data over a first data channel 190 and a second memory array receiving the command may transmit a second set of data over a second data channel 190. If the command is a write command, a first memory array 170 receiving the command may write to memory a first set of data received over a first data channel 190 and a second memory array 170 receiving the command may write to memory a second set of data received over a second data channel 190.

In some cases, the channels 115 may include one or more other channels 192 that may be dedicated to other purposes. These other channels 192 may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In general, splitting a memory device 110 (e.g., a DRAM) into multiple logical channels may enable an effectively decreased granularity and a larger die size. Additionally, splitting the memory device 110 into multiple logical channels may enable the memory device 110 to meet bandwidth constraints while working with a limited internal array speed.

Using a CA interface to control multiple data channels 190 or data interfaces (e.g., memory arrays) may enable decreased pin overhead. Using one set of pins for a CA interface instead of multiple sets of pins associated with multiple CA interfaces may decrease a latency associated with receiving or writing data. Additionally, using a CA interface to control multiple data channels 190 may lower operating power. For instance, when each CA interface of a memory device 110 controls one data channel 190, each CA interface may be active and may consume a certain amount of power. However, when one CA interface controls multiple data channels 190, CA interfaces associated with the other data channels 190 may be deactivated. Deactivating these CA interfaces may lower an overall amount of power consumption associated with operating CA interfaces because fewer pins may be driven (e.g., just the pins for the CA interface controlling the multiple data channels may be driven).

When a CA interface is configured to control multiple data channels 190 or data interfaces at boot-time, an overall lesser amount of hardware or physical circuit board (PCB) material may be used. For instance, a system that uses a 2-channel memory array may be designed to always operate such that a CA interface controls multiple data channels 190. As such, pins may not be provided for CA interfaces which may otherwise control one of the multiple data channels 190. When a CA interface is configured to control multiple data channels 190 via a command (e.g., a Mode Register Set command) sent by a host device, meanwhile, configurations may be performed dynamically (e.g., done-on-the-fly), which may enable the host device to control whether a CA interface is configured to control multiple data channels or a single data channel during operation. In such a fashion, a memory device 110 may be able to temporarily save operating power.

In general, memory devices (e.g., synchronous graphics RAM (SGRAM)) that are split into multiple logical channels may preserve access granularity. A memory device with one (1) logical channel, 32 pins for the logical channel, and that outputs data in bursts of eight (8) along the 32 pins may output 256 bits or 32 bytes of data for a given operation. A memory device with two (2) logical channels, sixteen (16) pins for each logical channel, and that outputs data in bursts of 16 along the 16 pins may output 2×256 bits or 2×32 bytes of data for a given operation. A memory device with four (4) logical channels, 8 pins per channel, and that outputs data in bursts of 32 along the pins may output 4×256 bits or 4×32 bytes of data. In each of these cases, an access granularity (e.g., of 32 bytes) may be preserved.

Figure 2:
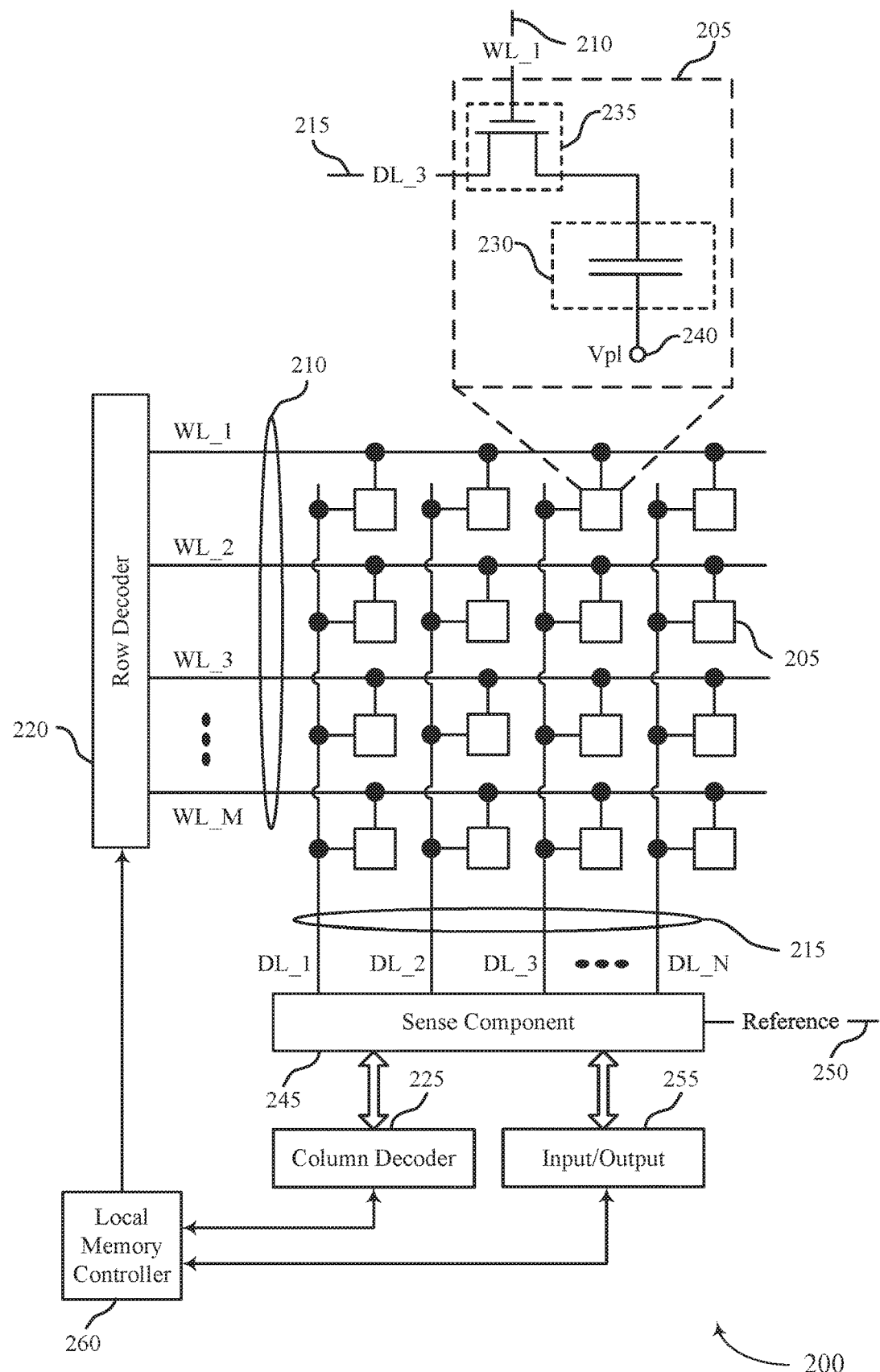
FIG. 2 illustrates an example of a memory die that supports reconfigurable channel interfaces for memory devices in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled through and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of the memory cell 205 may be provided as an output of the sense component 245 (e.g., to an input/output 255), and may indicate the detected logic state to another component of a memory device 110 that includes the memory die 200, such as a device memory controller 155 (e.g., directly or using the local memory controller 260).

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

The local memory controller 260 may contain a CA interface configured to receive and commands over a CA channel 186. In some cases, a selection component may isolate the CA interface from one or more memory arrays of the memory die 200 associated with a logical channel corresponding to the CA interface. Additionally or alternatively, the selection component may couple the CA interface with one or more memory arrays of the memory die 200 associated with a logical channel corresponding to a different CA interface.

In some cases, the CA interface may be deactivated when isolated from the one or more memory arrays and may be activated or reactivated when coupled with one or more memory arrays.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 (e.g., via a command received from a CA interface over an internal channel) on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state. In general, the local memory controller 260 may receive an indication of what to write to the memory cells 205 from a data channel 190 coupled with the local memory controller 260.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation (e.g., via a command received from a CA interface over an internal channel). The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 over a data channel 190 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3A:
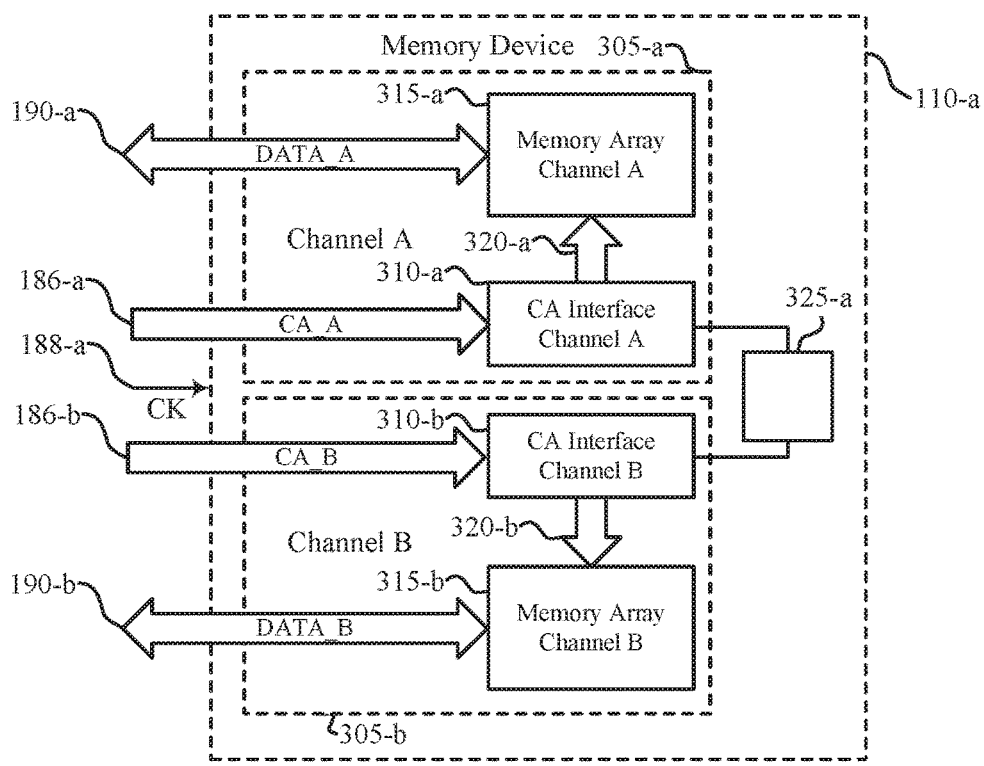
FIGS. 3A and 3B illustrate examples of channel configurations of a memory device that support reconfigurable channel interfaces for memory devices in accordance with examples as disclosed herein.

FIG. 3A may illustrate an example of a channel configuration 300-a of a memory device 110-a. Channel configuration 300-a may be an example of a 2-CA interface configuration. In other examples, channel configuration 300-a may be for any quantity of CA interfaces. In channel configuration 300-a, the memory device 110-a may have two logical channels 305, where each logical channel 305 may have an associated CA channel 186 and data channel 190. For instance, logical channel 305-a may have a CA channel 186-a and a data channel 190-a and logical channel 305-b may have a CA channel 186-b and a data channel 190-b. Additionally, memory device 110-a may have a CK channel 188-a that may be common to both of the two logical channels 305. In some cases, memory device 110-a may have a CK channel 188 for each logical channel 305.

Each CA channel 186 may communicate commands between a host device and a CA interface 310. Each data channel 190 may communicate data between a host device and a memory array 315. For instance, CA channel 186-a may carry commands to or from CA interface 310-a and data channel 190-a may carry data to or from memory array 315-a. Additionally, CA channel 186-b may carry commands to or from CA interface 310-b and data channel 190-b may carry data to or from memory array 315-b. In general, the commands and data may come from a host device. Additionally, each CA interface 310 may forward commands to memory array 315 via an internal channel 320. For instance, CA interface 310-a may forward commands via internal channel 320-a to memory array 315-a and CA interface 310-b may forward commands via internal channel 320-b to memory array 315-b.

To perform a read operation, one of CA interface 310-a and 310-b may receive a read command from a host device over CA channel 186-a or 186-b, respectively. If CA interface 310-a receives the read command, CA interface 310-a may forward the read command via internal channel 320-a to memory array 315-a. 1f CA interface 310-b receives the read command, CA interface 310-b may forward the read command via internal channel 320-b to memory array 315-b. Upon receiving the forwarded read command, memory array 315-a or 315-b may transmit data corresponding to the read command over data channel 190-a or 190-b, respectively. The host device may receive the transmitted data.

To perform a write operation, one of CA interface 310-a and 310-b may receive a write command from a host device. If CA interface 310-a receives the write command, CA interface 310-a may forward the write command to memory array 315-a and if CA interface 310-b receives the write command, CA interface 310-b may forward the write command to memory array 315-b. Upon receiving the forwarded write command, memory array 315-a or 315-b may write and store data received over data channel 190-a or 190-b, respectively, from the host device.

Figure 3B:
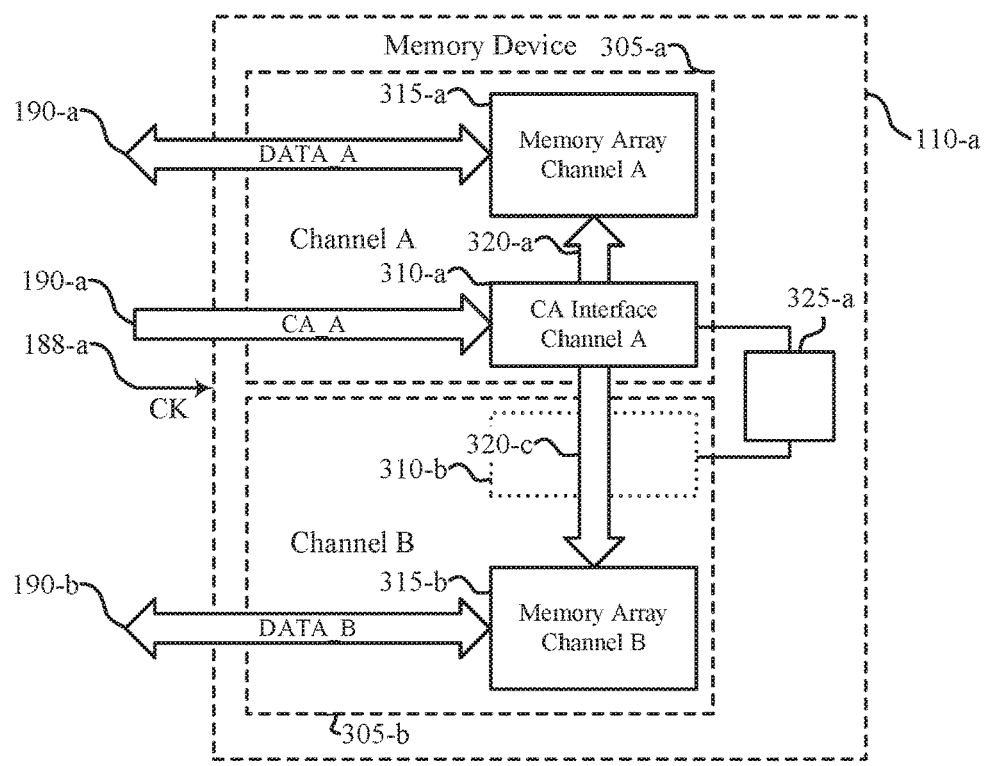

FIG. 3B may illustrate an example of a different channel configuration 300-b for memory device 110-a. Channel configuration 300-b may be an example of a 2-CA interface configuration. In other examples, channel configuration 300-b may be for any quantity of CA interfaces. For instance, CA interface 310-b may be deactivated (e.g., disabled) and decoupled (e.g., disconnected, isolated) from the memory array 315-b. Additionally or alternatively, CA interface 310-b may be ignored by memory device 110-a when memory device 110-a receives commands from the host device. Additionally CA interface 310-a may be coupled with memory array 315-b via internal channel 320-c. This process of coupling and decoupling may be achieved, at least in part, based on a selection component 325-a coupled with CA interface 310-a and CA interface 310-b. Selection component 325-a may additionally be configured to deactivate CA interface 310-*b*. More details about the coupling and decoupling process may be described with reference to FIG. 6A.

To transition from channel configuration 300-*a* to channel configuration 300-*b*, CA interface 310-*a* may receive a configuration command (e.g., a Mode Register Set command) from a host device over CA channel 186-*a*. Alternatively, the configuration command may be received by CA interface 310-*b* over CA channel 186-*b*. In any case, after the configuration command is received, selection component 325-*a* may deactivate CA interface 310-*b* (e.g., make CA interface 310-*b* dormant) and may disconnect internal channel 320-*b*. Additionally, selection component 325-*a* may connect internal channel 320-*c* between CA interface 310-*a* and memory array 315-*b*. To transition back from channel configuration 300-*h* to channel configuration 300-*a*, CA interface 310-*a* may receive another configuration command from the host device over CA channel 186-*a*. After CA interface 310-*a* receives the other configuration command, selection component 325-*a* may activate CA interface 310-*b* and may connect internal channel 320-*b*. Additionally, selection component 325-*a* may disconnect internal channel 320-*c* between CA interface 310-*a* and memory array 315-*b*. More details about receiving the configuration command may be discussed with regards to FIG. 5.

Alternatively, channel configuration 300-*a* or 300-*b* may be set at boot time. In such cases, one or more pins of at least some of the CA interfaces 310 may be pulled to a predefined logic level (e.g., a high logic level or a low logic level). Memory device 110-*a* may latch this logic level with the inactive edge of a RESET input and may store this value. Memory device HO-*a* may store this value until memory device 110-*a* loses power or until a subsequent reset is issued. In some cases, when set at boot-time, memory device 110-*a* may be in a static configuration (e.g., always in channel configuration 300-*b*). In such cases, CA interface 310-*b* and/or selection component 325-*a* may not be included.

In some cases, channel configurations 300 may not be set by configuration commands. For instance, channel configuration 300-*a* or 300-*b* may be hard-wired on a physical circuit board (PCB) making up memory device 110-*a* (e.g., memory device 110-*a* may have one or more dedicated pins for the configuration).

Once in channel configuration 300-*b*, CA interface 310-*b* may not react to external signals received by the CA interface 310-*b* and may refrain from decoding commands. Instead, the commands for the second memory array 315-*b* may be received over CA interface 310-*a*. In such cases, the flow of information over the data channel 190-*b* may be controlled using commands received from the CA interface 310-*a*. Additionally, if each logical channel 305 has a corresponding clock (e.g., a corresponding CK channel 188), the CK channel 188 associated with logical channel 305-*b* may not be used. In general, the configuration choice (e.g., channel configuration 300-*a* or channel configuration 300-*b*) may have no impact on data channels 190 of memory device 110-*a*. The configuration, however, may affect the CA interfaces 310 and their related command decoders.

In channel configuration 300-*b*, performing a read command may involve CA interface 310-*a* receiving a read command from a host device over CA channel 186-*a*. In some cases, CA interface 310-*a* may forward the read command to memory arrays 315-*a* and 315-*b* (e.g., via internal channels 320-*a* and 320-*c*, respectively). Upon receiving the read command, memory array 315-*a* may retrieve and transmit a first set of data corresponding to the read command over data channel 190-*a* and memory array 315-*b* may retrieve and transmit a second set of data corresponding to the read command over data channel 190-*b*. The host device may receive both sets of data. In general, data channels 190-*a* and 190-*b* may operate in sync in channel configuration 300-*b* and may transmit or retrieve their corresponding sets of data at approximately a same time.

In channel configuration 300-*b*, performing a write command may involve CA interface 310-*a* receiving a write command from a host device over CA channel 186-*a*. In some cases, CA interface 310-*a* may forward the write command to memory arrays 315-*a* and 315-*b* (e.g., via internal channels 320-*a* and 320-*c*, respectively). Upon receiving the write command, memory array 315-*a* may write to memory a first set of data received from the host device over data channel 190-*a* and memory array 315-*b* may write to memory a set of data received from the host device over data channel 190-*b*. In general, data channels 190-*a* and 190-*b* may operate in sync in channel configuration 300-*b* and may receive or write their corresponding sets of data at approximately a same time.

If in channel configuration 300-*b*, data received or transmitted to memory device 110-*a* may be associated with a granularity twice as large as a granularity associated with data received or transmitted to memory device 110-*a* in channel configuration 300-*a*. For instance, channel configuration 300-*b* may be associated with a 64-byte access granularity and channel configuration 300-*a* may be associated with a 32-byte access granularity.

Generally, devices with configurable access granularity may choose a granularity based on an amount of data that is requested to be written or stored by an application. Choosing the granularity based on the amount of data may enable the device to more effectively communicate data. For instance, if an application requests 64 bytes of data and a memory device 110 with static access granularity has a granularity of 32 bytes, the memory device 110 may perform two read operations to retrieve the data. However, if the memory device 110 has configurable granularity, the memory device 110 may use a granularity of 64 bytes and may perform a single read operation, which may be associated with less latency than two read operations. On the other hand, if an application requests 32 bytes of data and a memory device 110 with static access granularity has a granularity of 64 bytes, the memory device 110 may retrieve more data than what is requested by the application. The extra data may be discarded, but communicating the data may take extra time. However, if the memory device 110 has configurable granularity, the memory device 110 may use a granularity of 32 bytes and may retrieve the requested data without the extra 32 bytes.

Figure 4A:
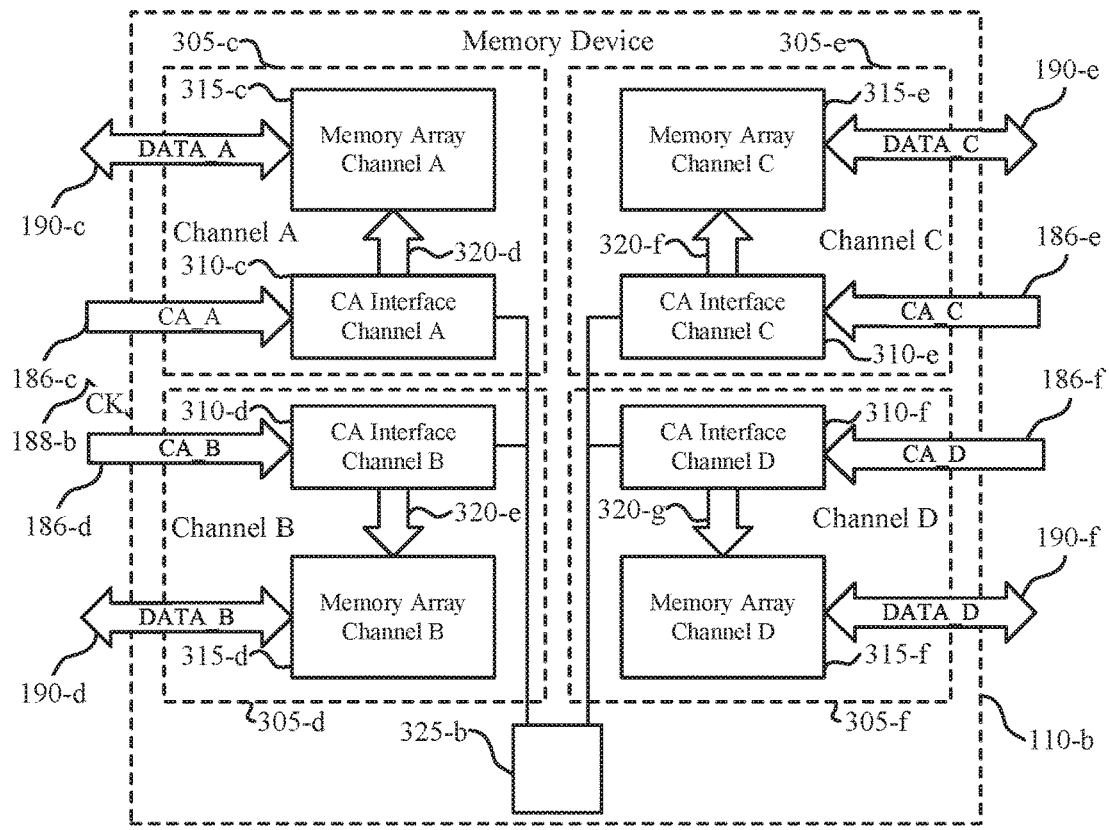
FIGS. 4A, 4B, and 4C illustrate examples of channel configurations of memory devices that support reconfigurable channel interfaces for memory devices in accordance with examples as disclosed herein.

FIG. 4A may illustrate an example of a channel configuration 400-*a* of a memory device 110-*b*. Channel configuration 400-*a* may be an example of a 4-CA interface configuration. In other examples, channel configuration 400-*a* may be for any quantity of CA interfaces. In channel configuration 400-*a*, memory device 110-*b* may have four logical channels 305, where each logical channel 305 may have an associated CA channel 186 and data channel 190. For instance, logical channel 305-*c* may have a CA channel 186-*c* and a data channel 190-*c*; logical channel 305-*d* may have a CA channel 186-*d* and a data channel 190-*d*; logical channel 305-*e* may have a CA channel 186-*e* and a data channel 190-*e*; and logical channel 305-*f* may have a CA channel 186-*f* and a data channel 190-*f*. Additionally, memory device 110-*b* may have a CK channel 188-*b* that may be common to the four logical channels 305. In some cases, memory device 110-*b* may have a CK channel 188 for each logical channel 305.

Each CA channel 186 may communicate commands between a host device and a CA interface 310. Each data channel 190 may communicate between a host device and a memory array 315. For instance, CA channel 186-*c* may carry commands to or from CA interface 310-*c* and data channel 190-*c* may carry data to or from memory array 315-*c*. Additionally, CA channel 186-*d* may carry commands to or from CA interface 310-*d* and data channel 190-*d* may carry data to or from memory array 315-*d*. Additionally, CA channel 186-*e* may carry commands to or from CA interface 310-*e* and data channel 190-*e* may carry data to or from memory array 315-*e*. Additionally, CA channel 186-*f* may carry commands to or from CA interface 310-*f* and data channel 190-*f* may carry data to or from memory array 315-*f*. In general, the commands and data may come from a host device. Additionally, each CA interface 310 may forward commands to memory array 315 via an internal channel 320. For instance, CA interface 310-*c* may forward commands to memory array 315-*c* via internal channel 320-*d*; CA interface 310-*d* may forward commands to memory array 315-*d* via internal channel 320-*e*; CA interface 310-*e* may forward commands to memory array 315-*e* via internal channel 320-*f*; and CA interface 310-*f* may forward commands to memory array 315-*f* via internal channel 320-*g*.

To perform a read operation, one of CA interfaces 310-*c*, 310-*d*, 310-*e*, or 310-*f* may receive a read command from a host device over CA channel 186-*c*, 186-*d*, 186-*e*, or 186-*f*, respectively. If CA interface 310-*c* receives the read command, CA interface 310-*c* may forward the read command to memory array 315-*c* (e.g., via internal channel 320-*d*). If CA interface 310-*d* receives the read command, CA interface 310-*d* may forward the read command to memory array 315-*d* (e.g., via internal channel 320-*e*). If CA interface 310-*e* receives the read command, CA interface 310-*e* may forward the read command to memory array 315-*e* (e.g., via internal channel 320-*f*). If CA interface 310-*f* receives the read command, CA interface 310-*f* may forward the read command to memory array 315-*f* (e.g., via internal channel 320-*g*). Upon receiving the forwarded read command, memory array 315-*c*, 315-*d*, 315-*e*, or 315-*f* may transmit data corresponding to the read command over data channel 190-*c*, 190-*d*, 190-*e*, or 190-*f*, respectively. The host device may receive the transmitted data.

To perform a write operation, one of CA interface 310-*c*, 310-*d*, 310-*e*, or 310-*f* may receive a write command from a host device. If CA interface 310-*c* receives the write command, CA interface 310-*c* may forward the write command to memory array 315-*c* (e.g., via internal channel 320-*d*). If CA interface 310-*d* receives the write command, CA interface 310-*d* may forward the write command to memory array 315-*d* (e.g., via internal channel 320-*e*). If CA interface 310-*e* receives the write command, CA interface 310-*e* may forward the write command to memory array 315-*e* (e.g., via internal channel 320-*f*). If CA interface 310-*f* receives the write command, CA interface 310-*f* may forward the write command to memory array 315-*f* (e.g., via internal channel 320-*g*). Upon receiving the forwarded write command, memory array 315-*c*, 315-*d*, 315-*e*, 315-*f* may write data received over data channel 190-*c*, 190-*d*, 190-*e*, or 190-*f*, respectively, from the host device.

Figure 4B:
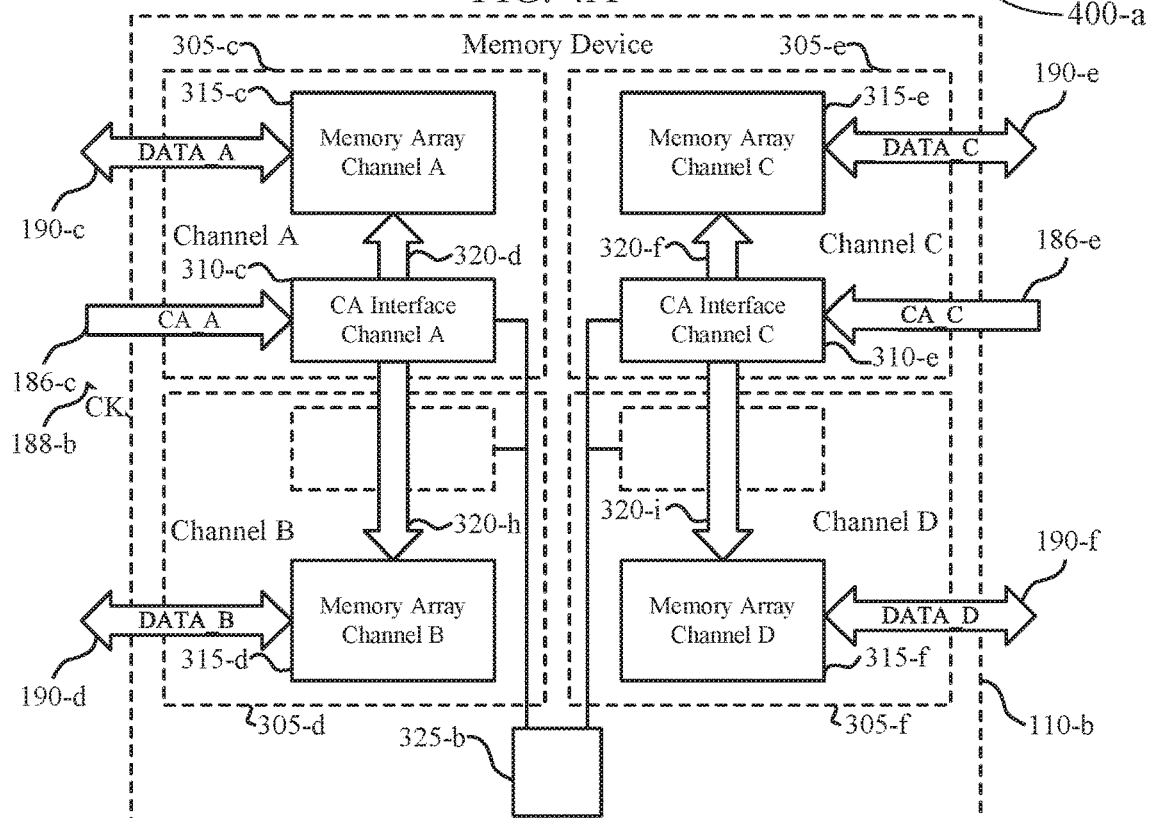

FIG. 4B may illustrate an example of a different channel configuration 400-*b* for memory device 110-*b*. Channel configuration 400-*b* may be an example of a 4-CA interface configuration. In other examples, channel configuration 400-*b* may be for any quantity of CA interfaces. For instance, CA interface 310-*d* may be deactivated and decoupled from memory array 315-*d* and CA interface 310-*f* may be deactivated and decoupled from memory array 315-*f*. Additionally or alternatively, CA interfaces 310-*d* and 310-*f* may be ignored by memory device 110-*b* when memory device 110-*b* receives commands from a host device. Additionally CA interface 310-*c* may be coupled with memory array 315-*d* via internal channel 320-*h* and CA interface 310-*e* may be coupled with memory array 315-*f* via internal channel 320-*i*. This process of coupling and decoupling may be achieved, at least in part, based on a selection component 325-*b* coupled with CA interfaces 310-*c*, 310-*d*, 310-*e*, and 310-*f*. More details about the coupling and decoupling process may be described with reference to FIG. 6B.

To transition from channel configuration 400-*a* to channel configuration 400-*b*, CA interface 310-*c* or 310-*e* may receive a configuration command (e.g., a Mode Register Set command) from a host device over CA channel 186-*c* or 186-*c*, respectively. Alternatively, the configuration command may be received by CA interface 310-*d* or 310-*f* over CA channel 186-*d* or 186-*f*, respectively. In any case, after the configuration command is received, selection component 325-*b* may deactivate CA interfaces 310-*d* and 310-*f* (e.g., make CA interfaces 310-*d* and 310-*f* dormant) and may disconnect internal channels 320-*e* and 320-*g*, respectively. Additionally, selection component 325-*b* may connect internal channel 320-*h* between CA interface 310-*c* and memory array 315-*d* and internal channel 320-*i* between CA interface 310-*e* and memory array 315-*f*. More details about receiving the configuration command may be discussed with regards to FIG. 5.

To transition back from channel configuration 400-*b* to channel configuration 400-*a*, CA interface 310-*c* or 310-*e* may receive a configuration command (e.g., a Mode Register Set command) from a host device over CA channel 186-*c* or 186-*e*, respectively. After the configuration command is received, selection component 325-*b* may activate CA interface 310-*d* and may connect internal channel 320-*e*. Additionally, selection component 325-*b* may activate CA interface 310-*f* and may connect internal channel 320-*g*. Additionally, selection component 325-*b* may disconnect internal channel 320-*h* between CA interface 310-*c* and memory array 315-*d* and internal channel 320-*i* between CA interface 310-*e* and memory array 315-*f*.

Once in channel configuration 400-*b*, CA interfaces 310-*d* and 310-*f* may not react to external signals and may stop receiving and decoding commands. Instead, commands for CA interface 310-*d* may be received via CA interface 310-*c* and commands for CA interface 310-*f* may be received via CA interface 310-*e*. Additionally, if each logical channel 305 has a corresponding clock (e.g., a corresponding CK channel 188), the CK channels 188 associated with logical channels 305-*d* and 305-*f* may not be used.

In channel configuration 400-*b*, performing a read command may involve CA interface 310-*c* or 310-*e* receiving a read command from a host device over CA channel 186-*c* or 186-*e*, respectively. In some cases, CA interface 310-*c* may forward a received read command to memory arrays 315-*c* and 315-*d* (e.g., via internal channels 320-*d* and 320-*h*, respectively) and CA interface 310-*e* may forward a received read command to memory arrays 315-*e* and 315-*f* (e.g., via internal channels 320-*f* and 320-*i*, respectively). Upon receiving the read command from CA interface 310-*c*, memory array 315-*c* may retrieve and transmit a set of data corresponding to the received read command over data channel 190-c and memory array 315-d may retrieve and transmit a set of data corresponding to the received read command over data channel 190-d. Upon receiving the read command from CA interface 310-e, meanwhile, memory array 315-e may retrieve and transmit a set of data corresponding to the received read command over data channel 190-e and memory array 315-f may retrieve and transmit a set of data corresponding to the received read command over data channel 190-f. In general data channels 190-c may operate in sync with data channel 190-d and data channel 190-e may operate in sync with data channel 190-f in channel configuration 400-b, and their corresponding memory arrays 315 may transmit or retrieve their corresponding sets of data at approximately a same time.

In channel configuration 400-b, performing a write command may involve CA interface 310-c or 310-e receiving a write command from a host device over CA channel 186-c or 186-e, respectively. In some cases, CA interface 310-c may forward a received write command to memory arrays 315-c and 315-d, (e.g., via internal channels 320-d and 320-h, respectively) and CA interface 310-e may forward a received write command to memory arrays 315-e and 315-f (e.g., via internal channels 320-f and 320-i, respectively). Upon receiving a write command from CA interface 310-c, memory array 315-c may write a set of data received from the host device over data channel 190-c to memory and memory array 315-d may write a set of data received from the host device over data channel 190-d to memory. Upon receiving a write command from CA interface 310-e, meanwhile, memory array 315-e may write a set of data received from the host device over data channel 190-e to memory and memory array 315-f may write a set of data received from the host device over data channel 190-f to memory. In general data channels 190-c may operate in sync with data channel 190-d and data channel 190-e may operate in sync with data channel 190-f in channel configuration 400-b, and their corresponding memory arrays 315 may receive or write their corresponding sets of data at approximately a same time.

Figure 4C:
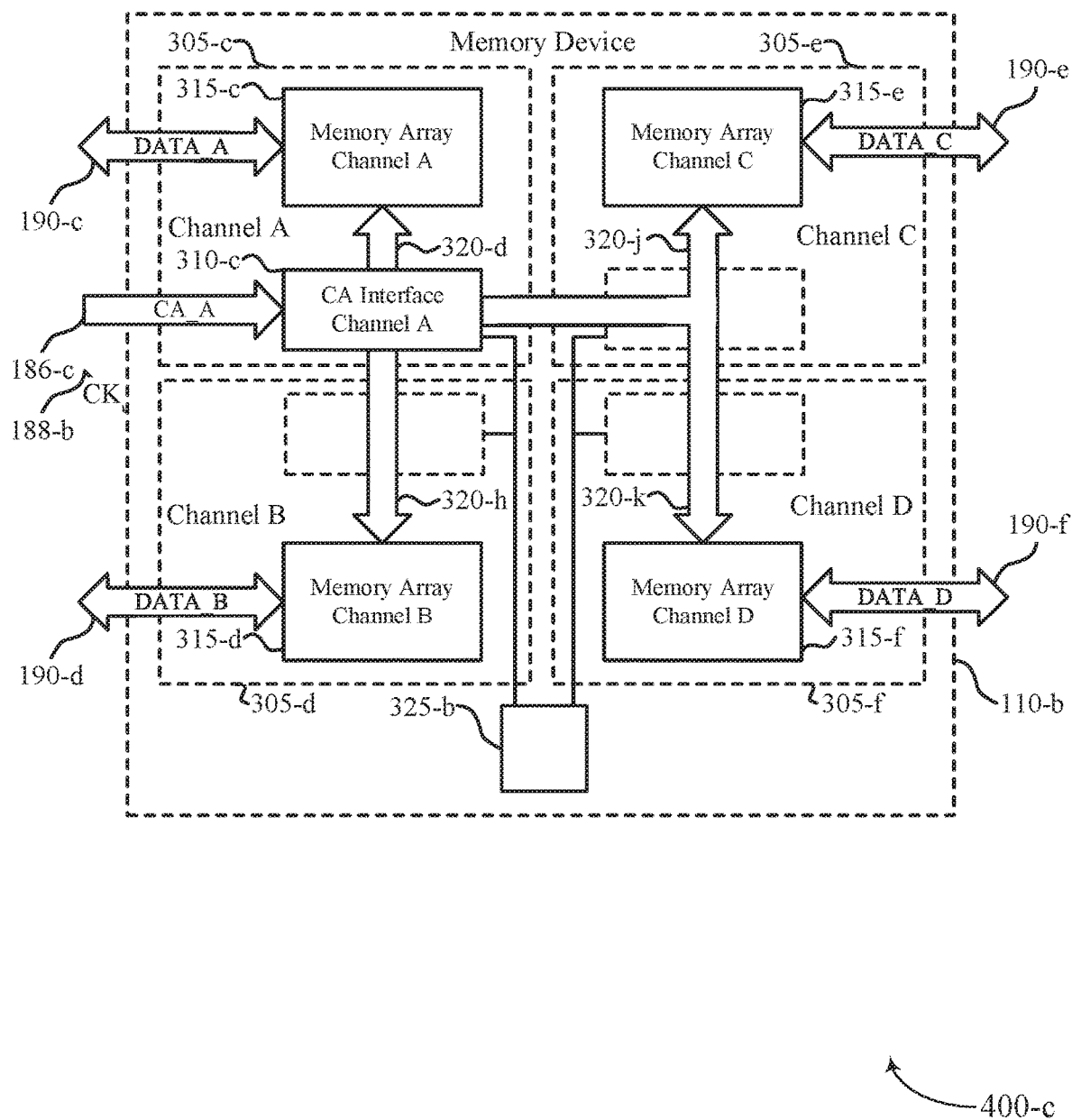

FIG. 4C may illustrate an example of a different channel configuration 400-c for memory device 110-b. Channel configuration 400-c may be an example of a 4-CA interface configuration. In other examples, channel configuration 400-c may be for any quantity of CA interfaces. For instance, CA interface 310-d may be deactivated and decoupled from memory array 315-d; CA interface 310-e may be deactivated and decoupled from memory array 315-e; and CA interface 310-f may be deactivated and decoupled from memory array 315-f. Additionally or alternatively, CA interfaces 310-d, 310-e, and 310-f may be ignored by memory device 110-b when memory device 110-b receives commands from the host device. Additionally, CA interface 310-c may be coupled with memory array 315-d via internal channel 320-h, coupled with memory array 315-e via internal channel 320-j, and coupled with memory array 315-f via internal channel 320-k. The process of coupling and decoupling may be achieved, at least in part, based on selection component 325-b coupled with CA interfaces 310-c, 311.0-d, 310-e, and 310-f. More details about the coupling and decoupling process may be discussed with regards to FIG. 6B.

To transition from channel configuration 400-a to channel configuration 400-c, CA interface 310-c may receive a configuration command (e.g., a Mode Register Set command) from a host device over CA channel 186-c. Alternatively, the configuration command may be received by one of CA interfaces 310-d, 310-e, or 310-f over CA channel 186-d, 186-e, or 186-f, respectively. In any case, after the configuration command is received, selection component 325-b may deactivate CA interfaces 310-d, 310-e, and 310-f (e.g., make CA interfaces 310-d, 310-e, and 310-f dormant) and may disable the internal channels 320-e, 320-f, and 320-g. Additionally, selection component 325-b may connect internal channel 320-h between CA interface 310-c and memory array 315-d, internal channel 320-j between CA interface 310-c and memory array 315-e, and internal channel 320-k between CA interface 310-c and memory array 315-f.

To transition back from channel configuration 400-c to channel configuration 400-a, CA interface 310-c may receive another configuration command from the host device over CA channel 186-c. After CA interface 310-c receives the other configuration command, selection component 325-b may activate CA interfaces 310-d, 310-e, and 310-f and may connect internal channels 320-e, 320-f, and 320-g, respectively. Additionally, selection component 325-b may disconnect internal channel 320-h between CA interface 310-c and memory array 315-d, internal channel 320-j between CA interface 310-c and memory array 315-e, and internal channel 320-k between CA interface 310-c and memory array 315-f.

In a similar manner, to transition from channel configuration 400-b to channel configuration 400-c, CA interface 310-c or 310-e may receive the configuration command from the host device over CA channel 186-c or 186-e. After the switching command is received, selection component 325-b may deactivate CA interface 310-e (e.g., make CA interface 310-e dormant) and may disconnect internal channel 320-i. Additionally, selection component 325-b may connect internal channel 320-j between CA interface 310-c and memory array 315-e and internal channel 320-k between CA interface 310-c and memory array 315-f.

To transition back from channel configuration 400-c to channel configuration 400-b, CA interface 310-c may receive another configuration command from the host device over CA channel 186-c. After CA interface 310-c receives the other configuration command, selection component 325-b may activate CA interface 310-e and may connect internal channel 320-i. Additionally, selection component 325-b may disconnect internal channel 320-j between CA interface 310-c and memory array 315-e and internal channel 320-k between CA interface 310-c and memory array 315-f. More details about receiving the configuration command may be discussed with regards to FIG. 5.

Once in channel configuration 400-c, CA interfaces 310-d, 310-e, and 310-f may not react to external signals and may stop receiving and decoding commands. Instead, the commands may be received via CA interface 310-c and control of data channels 190-d, 190-e, and 190-f may be derived from CA interface 310-c. Additionally, if each logical channel 305 has a corresponding clock (e.g., a corresponding CK channel 188), the CK channels 188 associated with logical channels 305-d, 305-e, and 305-f may not be used.

In channel configuration 400-c, performing a read command may involve CA interface 310-c receiving a read command from a host device over CA channel 186-c. In some cases, CA interface 310-c may forward the read command to memory arrays 315-c, 315-d, 315-e, and 315-f (e.g., via internal channels 320-d, 320-h, 320-j, and 320-k, respectively). Upon receiving the read command, memory array 315-c may retrieve and transmit a first set of data corresponding to the read command over data channel 190-c; memory array 315-d may retrieve and transmit a second set of data corresponding to the read command over data channel 190-*d*; memory array 315-*e* may retrieve and transmit a third set of data corresponding to the read command over data channel 190-*e*; and memory array 315-*f* may retrieve and transmit a fourth set of data corresponding to the read command over data channel 190-*f*. The host device may receive four sets of data. In general, data channels 190-*c*, 190-*d*, 190-*e*, and 190-*f* may operate in sync in channel configuration 400-*c* and their corresponding memory arrays 315 may transmit or retrieve their corresponding sets of data at approximately a same time.

In channel configuration 400-*c*, performing a write command may involve CA interface 310-*c* receiving a write command from a host device over CA channel 186-*c*. In some cases, CA interface 310-*c* may forward the write command to memory arrays 315-*c*, 315-*d*, 315-*e*, and 315-*f* (e.g., via internal channels 320-*d*, 320-*h*, 320-*j*, and 320-*k*, respectively). Upon receiving the write command, memory array 315-*c* may write a first set of data received from the host device over data channel 190-*c*; memory array 315-*d* may write a second set of data received from the host device over data channel 190-*d*; memory array 315-*e* may write a third set of data received from the host device over data channel 190-*e*; and memory array 315-*f* may write a fourth set of data received from the host device over data channel 190-*f*. In general, data channels 190-*c*, 190-*d*, 190-*e*, and 190-*f* may operate in sync in channel configuration 400-*c* and their corresponding memory arrays 315 may receive or write their sets of data at approximately a same time.

In some cases, channel configuration 400-*a*, 400-*b*, or 400-*c* may be set at boot time. In such cases, one or more pins of at least some CA interfaces 310 may be pulled to a predefined logic level (e.g., a high logic level or a low logic level). Memory device 110-*b* may latch this logic level with the inactive edge of a RESET input and may store this value. Memory device 110-*b* may store this value until memory device 110-*b* loses power or until a subsequent reset is issued. In some cases, when set at boot-time, memory device 110-*b* may be in a static configuration (e.g., always in channel configuration 400-*b* or 400-*c*). If such is the case for channel configuration 400-*b*, selection component 325-*b*, CA interface 310-*d*, and CA interface 310-*f* may not be included. If such is the case for channel configuration 400-*c*, selection component 325-*b* and CA interfaces 310-*d*, 310-*e*, and 310-*f* may not be included.

In some cases, channel configurations 400 may not be set by configuration commands. For instance, channel configuration 400-*a*, 400-*b*, or 400-*c* may be hard-wired on a PCB making up memory device 110-*b*. In general, the configuration choice (e.g., between channel configurations 400-*a*, 400-*b*, and 400-*c*) may have no impact on data channels 190 of memory device 110-*b*. The configuration, however, may affect the CA interfaces 310 and their related command decoders.

An access granularity associated with channel configuration 400-*b* may be twice as large as a granularity associated with channel configuration 400-*a*. Additionally, an access granularity associated with channel configuration 400-*c* may be twice as large as a granularity associated with channel configuration 400-*b* and/or four times as large as a granularity associated with channel configuration 400-*a*. For instance, channel configuration 400-*c* may be associated with a one hundred twenty-eight (128)-byte granularity, channel configuration 400-*b* may be associated with a 64-byte granularity, and channel configuration 400-*a* may be associated with a 32-byte granularity.

Figure 5:
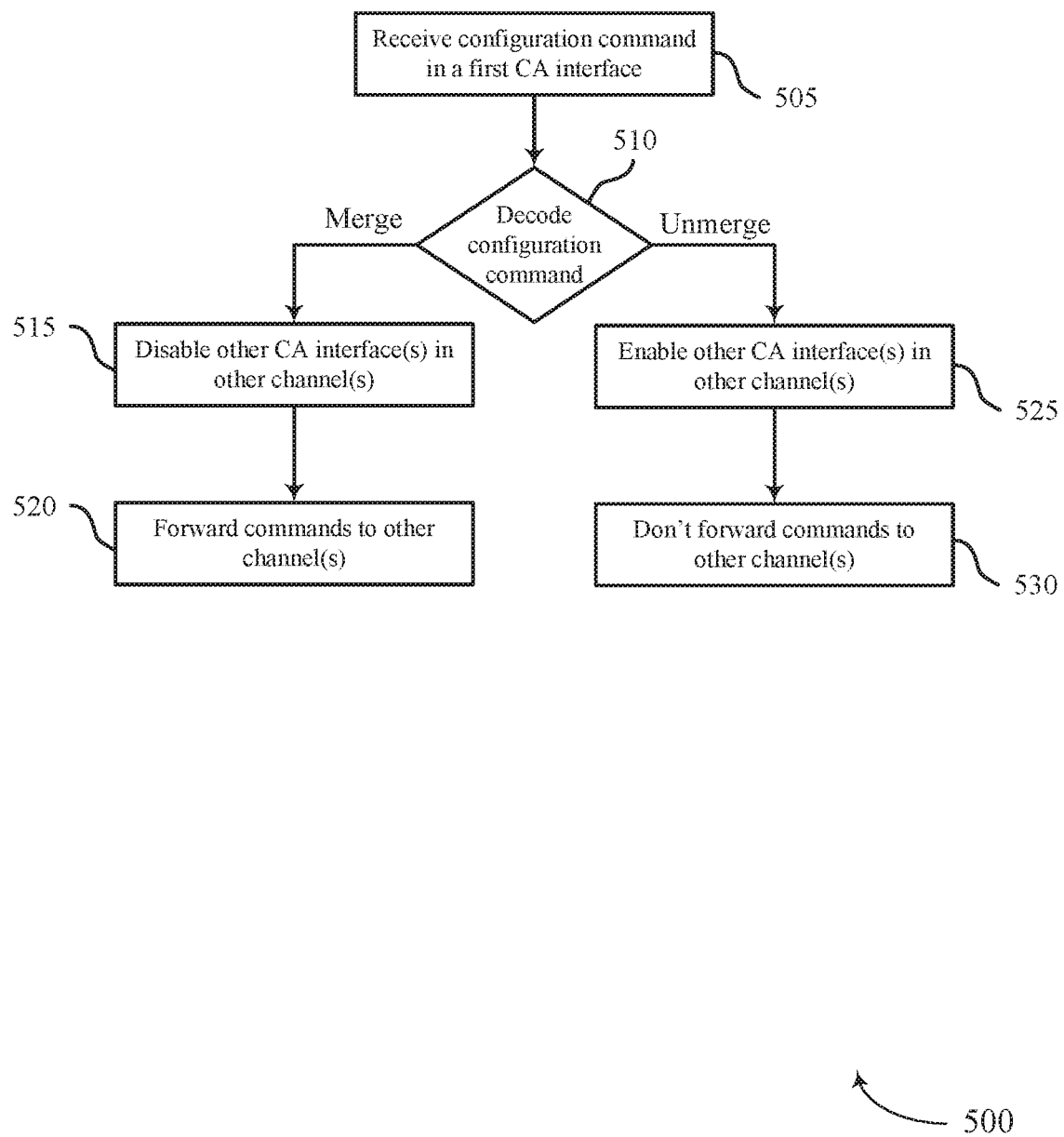
FIG. 5 illustrates an example of a flow diagram that supports reconfigurable channel interfaces for memory devices in accordance with examples as disclosed herein.

FIG. 5 illustrates an example of a flow diagram 500 that supports reconfigurable channel interfaces for memory devices in accordance with examples as disclosed herein. In some cases, flow diagram 500 may be implemented by a memory device 110 as described with reference to FIGS. 1 and 3A-4C.

At 505, the memory device 110 may receive a configuration command at a first CA interface 310 over a CA channel 186 from a host device. The first CA interface 310 may be associated with a first logical channel 305 of the memory device 110.

At 510, the memory device 110 may decode the configuration command. If the memory device 110 determines that the configuration command is decoded as a "merge" command, the memory device 110 may proceed to 515. If the memory device 110 decodes the configuration command as an "unmerge" command, the memory device 110 may proceed to 525.

At 515, the memory device 110 may disable one or more other CA interfaces 310 in other logical channels 305 (e.g., logical channels 305 beside the first logical channel 305). Additionally, the memory device may establish a connection between the first CA interface 310 and the memory array(s) 315 associated with the other logical channel (s) 305.

At 520, the first CA interface 310 may forward subsequent commands to the other logical channel(s). For instance, the memory device 110 may receive a command and may forward the command to the memory array(s) 315 in the other logical channel (s) 305 via the connection.

At 525, the memory device 110 may enable one or more other CA interfaces in other logical channels 305 (e.g., logical channels 305 beside the first logical channel 305). Additionally, the memory device may disconnect a connection between the first CA interface 310 and the memory array(s) 315 in the other logical channel (s) 305.

At 530, the first CA interface 310 may not forward subsequent commands received at the first CA interface to the other logical channel(s). For instance, the memory device 110 may receive a command and may not forward the command to memory arrays) 315 in other logical channel (s) 305. Instead, the memory device 110 may forward the command to memory array(s) 315 within the first logical channel 305.

Figure 6A:
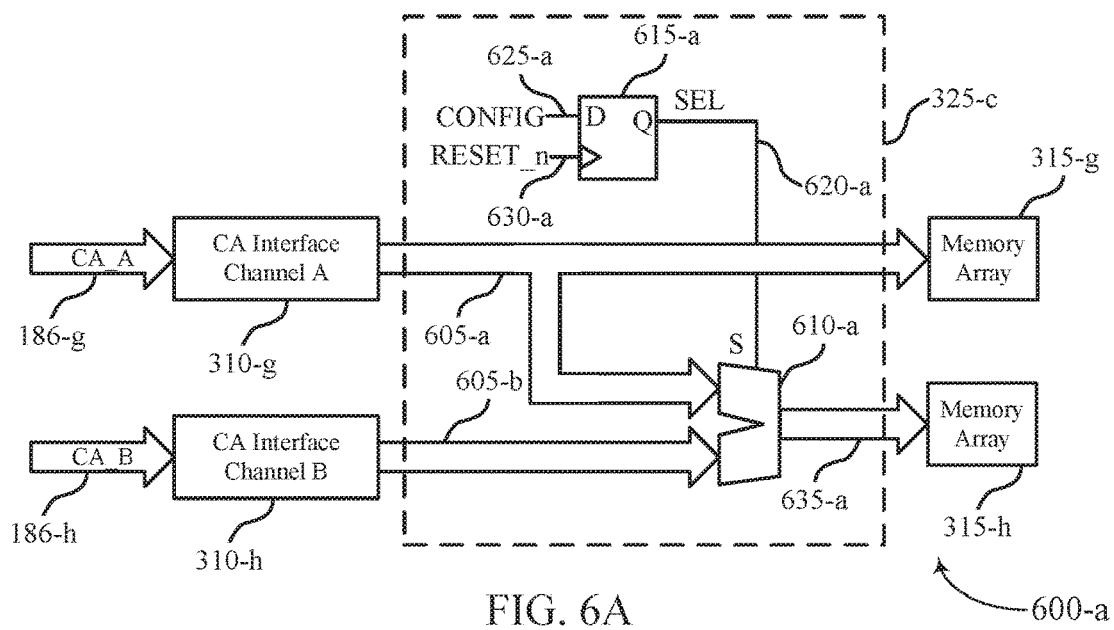
FIGS. 6A and 6B illustrate examples of routing schemes that support reconfigurable channel interfaces for memory devices in accordance with examples as disclosed herein.

FIG. 6A illustrates an example of a routing scheme 600-*a* showing a selection component 325-*c* configured to route commands between CA interfaces 310 and memory arrays 315 in accordance with examples as disclosed herein. In some examples, selection component 325-*c* may be an example of a selection component 325-*a* as described with reference to FIGS. 3A and 3B. Routing scheme 600-*a* may represent how a selection component 325-*c* may route commands between CA interfaces 310 and memory array 315. The paths illustrated in the routing scheme 600-*a* may represent at least portions of the internal channels 320 described with reference to FIGS. 3A 3B.

Selection component 325-*c* may be configurable in a variety of configurations. For example, selection component 325-*c* may be in a channel A configuration in which signals received from internal channel 605-*a* are routed to memory arrays 315-*g* and 315-*h*. Alternatively, selection component 325-*c* may be in a channel AB configuration in which signals received from internal 605-*a* are routed to memory array 315-*g* and signals received from internal channel 605-*b* are routed to memory array 315-*h*. In general, selection component 325-*c* being in the channel A configuration may correspond to memory device 110 being in channel configuration 300-*a*. Selection component 325-*c* being in the channel AB configuration may correspond to memory device 110 being in channel configuration 300-*b*.

To accomplish such routing, selection component 325-c may include a multiplexer 610-a and a latching component 615-a. Multiplexer 610-a may be coupled with first CA interface 310-g, second CA interface 310-h, and memory array 315-h. Multiplexer 610-a may also be coupled with latching component 615-a over selection signal path 620-a. Latching component 615-a may output a selection signal over selection signal path 620-a that causes multiplexer 610-a to selectively couple memory array 315-h with either first CA interface 310-g or second CA interface 310-h based on the value of the selection signal.

Which configuration multiplexer 610-a is in may depend on a value of a selection signal received from a latching component 615-a. For instance, if the selection signal is at a low value (e.g., a logical 0), multiplexer 610-a may be configured to couple first CA interface 310-g with memory array 315-h (e.g., via internal channel 605-a and internal channel 635-a). In such cases, selection component 325-c may be in the channel A configuration. If the selection signal is at a high value (e.g., a logical 1), multiplexer 610-a may be configured to couple second CA interface 310-h with memory array 315-h (e.g., via internal channel 605-b and internal channel 635-a). In such cases, selection component 325-c may be in the channel AB configuration. Latching component 615-a may determine a value of the selection signal by sampling a level of CONFIG input 625-a with a rising edge of RESET_n input 630-a.

In some examples, a command may be received by CA interface 310-g over CA channel 186-g. CA interface 310-g may forward the command over internal channel 605-a to memory array 315-g. CA interface 310-g may be coupled with memory array 315-g regardless of whether selection component 325-c is in the channel A configuration or the channel AB configuration. As such, CA interface 310-g may forward the command over internal channel 605-a to memory array 315-g regardless of whether selection component 325-c is in the channel A configuration or the channel AB configuration. Internal channel 605-a may correspond to internal channel 320-a in FIGS. 3A and 3B. If selection component 325-c is in the channel AB configuration, the command may not be forwarded to memory array 315-h (e.g., multiplexer 610-a may be isolating CA interface 310-g from memory array 315-h). However, if the selection component 325-c is in the channel A configuration, the command may be forwarded to memory array 315-h over internal channels 605-a and 635-a. Internal channel 605-a in combination with internal channel 635-a may correspond to internal channel 320-c described with reference to FIG. 3B.

In other examples, a command may be received by CA interface 310-h over CA channel 186-h. CA interface 310-h may forward the command over internal channel 605-b to multiplexer 610-a. If the selection component 325-c is in the channel AB configuration, the command may be forwarded to the memory array 315-h over internal channels 605-b and 635-a. Internal channel 605-b in combination with internal channel 635-a may correspond to internal channel 320-b described with reference to FIG. 3A. If selection component 325-c is in the channel A configuration, the command may not be forwarded to memory array 315-h (e.g., multiplexer 610-a may be isolating CA interface 310-h from memory array 315-h).

Figure 6B:
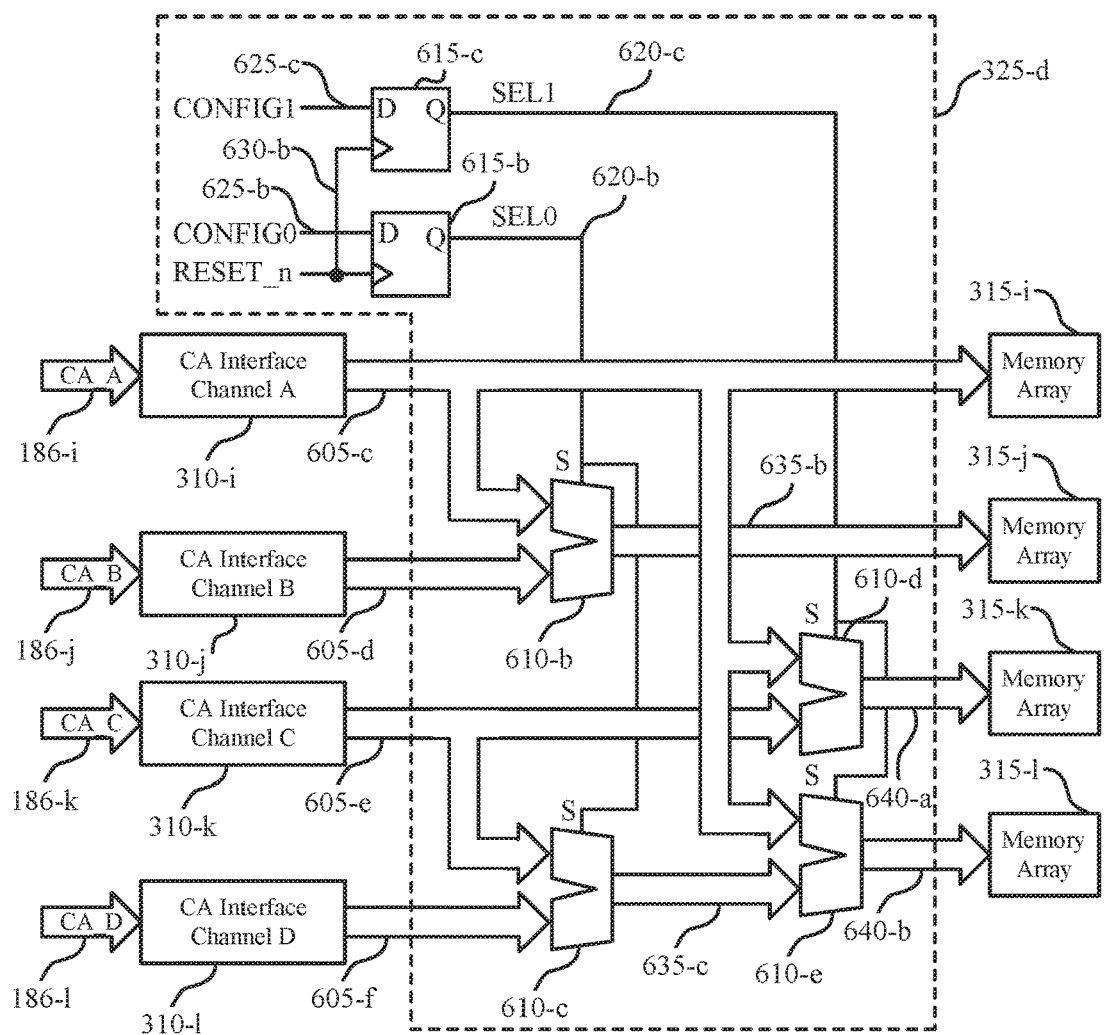

FIG. 6B illustrates an example of a routing scheme 600-b showing a selection component 325-d configured to route commands between CA interfaces 310 and memory arrays 315 in accordance with examples as disclosed herein. In some examples, selection component 325-d may be an example of a selection component 325-b as described with reference to FIGS. 4A, 4B, and 4C. Routing scheme 600-b may represent how selection component 325-d may route commands between CA interfaces 310 and memory array 315. The paths illustrated in routing scheme 600-b may represent at least portions of internal channels 320 as described with reference to FIGS. 4A-4C.

Selection component 325-d may be configurable in a variety of configurations. For example, selection component 325-d may be in a channel A configuration in which signals received from internal channel 605-c are routed to memory arrays 315-i, 315-j, 315-k, and 315-l. Alternatively, selection component 325-d may be in a channel AC configuration in which signals received from internal channel 605-c are routed to memory arrays 315-i and 315-j and signals received from internal channel 605-e are routed to memory arrays 315-k and 315-l. Alternatively, selection component 325-d may be in a channel ABCD configuration in which signals received from internal channel 605-c are routed to memory array 315-i; signals received from internal channel 605-d are routed to memory array 315-j; signals received from internal channel 605-e are routed to memory array 315-k and signals received from internal channel 605-f are routed to memory array 315-l. In general, selection component 325-d being in the channel A configuration may correspond to memory device 110 being in channel configuration 400-c; selection component 325-d being in the AB configuration may correspond to memory device 110 being in channel configuration 400-b; and selection component 325-d being in the ABCD configuration may correspond to a memory device 110 being in channel configuration 400-a.

To accomplish such routing, selection component 325-d may include a set of multiplexers 610. The set of multiplexers 610 may include multiplexer 610-b, 610-c, 610-d, and 610-e. Multiplexer 610-b may be coupled with first CA interface 310-i, second CA interface 310-j, and memory array 315-j. Multiplexer 610-c may be coupled with third CA interface 310-k, fourth CA interface 310-l, and multiplexer 610-e. Multiplexer 610-d may be coupled with first CA interface 310-i, third CA interface 310-k, and memory array 315-k. Multiplexer 610-e may be coupled with first CA interface 310-i, multiplexer 610-c, and memory array 315-l.

Selection component 325-d may also include a set of latching components 615. The set of latching components 615 may include latching components 615-b and 615-c. Multiplexers 610-b and 610-c may be coupled with latching component 615-b over selection signal path 620-b. Latching component 615-b may output a first selection signal over selection signal path 620-b that causes multiplexer 610-b to selectively couple memory array 315-j with either first CA interface 310-i or second CA interface 310-j based on the value of the first selection signal. Additionally, the first selection signal may cause multiplexer 610-c to selectively couple multiplexer 610-e with third CA interface 310-k or fourth CA interface 310-l based on the value of the first selection signal. Multiplexers 610-d and 610-e, meanwhile, may be coupled with latching component 615-c over selection signal path 620-c. Latching component 615-c may output a second selection signal over selection signal path 620-c that causes multiplexer 610-d to selectively couple memory array 315-k with first CA interface 310-i or third CA interface 310-k based on the value of the second selection signal. Additionally, the second selection signal may cause multiplexer 610-e to selectively couple memory array 315-l with first CA interface 310-i or multiplexer 610-c based on the value of the second selection signal.

Which configuration multiplexer 610-b is in may depend on a value of a selection signal received from a latching component 615-*b*. For instance, if the selection signal is at a low value (e.g., a logical 0), multiplexer 610-*b* may be configured to couple first CA interface 310-*i* with memory array 315-*j* (e.g., via internal channels 605-*c* and 635-*b*). In such cases, selection component 325-*d* may be in the channel A or channel AC configuration. If the selection signal is at a high value (e.g., a logical 1), multiplexer 610-*b* may be configured to couple second CA interface 310-*j* with memory array 315-*j* (e.g., via internal channels 605-*d* and 635-*b*). In such cases, selection component 325-*c* may be in the ABCD configuration. Latching component 615-*b* may determine a value of the selection signal by sampling a level of CONFIG. 0 input 625-*b* with a rising edge of RESET_n input 630-*b*.

Which configuration multiplexer 610-*c* is in may depend on a value of a selection signal received from a latching component 615-*b*. For instance, if the selection signal is at a low value (e.g., a logical 0), multiplexer 610-*c* may be configured to couple third CA interface 310-*k* with multiplexer 610-*c* (e.g., via internal channels 605-*e* and 635-*c*). In such cases, selection component 325-*d* may be in the channel A configuration or the channel AC configuration. If the selection signal is at a high value (e.g., a logical 1), multiplexer 610-*c* may be configured to couple fourth CA interface 310-*l* with multiplexer 610-*e* (e.g., via internal channels 605-*f* and 635-*c*). In such cases, selection component 325-*c* may be in the ABCD configuration. In some cases, multiplexer 610-*c* may couple third CA interface 310-*k* with multiplexer 610-*e* when multiplexer 610-*b* couples first CA interface 310-*i* with memory array 315-*j* and may couple fourth CA interface 310-*l* with multiplexer 610-*e* when multiplexer 610-*b* couples second CA interface 310-*j* with memory array 315-*j*.

Which configuration multiplexer 610-*d* is in may depend on a value of a selection signal received from a latching component 615-*c*. For instance, if the selection signal is at a low value (e.g., a logical 0), multiplexer 610-*d* may be configured to couple first CA interface 310-*i* with memory array 315-*k* (e.g., via internal channels 605-*c* and 640-*a*). In such cases, selection component 325-*d* may be in the channel A configuration. If the selection signal is at a high value (e.g., a logical 1), multiplexer 610-*d* may be configured to couple third CA interface 310-*k* with memory array 315-*k* (e.g., via internal channels 605-*e* and 640-*a*). In such cases, selection component 325-*d* may be in the AC configuration. Latching component 615-*c* may determine a value of the selection signal by sampling a level of CONFIG. 1 input 625-*c* with a rising edge of RESET_n input 630-*b*.

Which configuration multiplexer 610-*e* is in may depend on a value of a selection signal received from a latching component 615-*c*. For instance, if the selection signal is at a low value (e.g., a logical 0), multiplexer 610-*e* may be configured to couple first CA interface 310-*i* with memory array 315-*l* (e.g., via internal channels 605-*c* and 640-*b*). In such cases, selection component 325-*d* may be in the channel A configuration. If the selection signal is at a high value (e.g., a logical 1), multiplexer 610-*e* may be configured to couple multiplexer 610-*c* with memory array 315-*l* (e.g., via internal channel 635-*c*). In such cases, selection component 325-*d* may be in the AC or the ABCD configuration. Whether selection component 325-*d* is in the AC or the ABCD configuration may depend on the selection signal from latching component 615-*b*. In some cases, multiplexer 610-*e* may couple first CA interface 310-*i* with memory array 315-*l* when multiplexer 610-*d* couples first CA interface 310-*i* with memory array 315-*k* and may couple multiplexer 610-*c* with memory array 315-*l* when multiplexer 610-*d* couples third CA interface 310-*k* with memory array 315-*k*.

In some examples, a command may be received by first CA interface 310-*i* over CA channel 186-*i*. First CA interface 310-*i* may forward the command over internal channel 605-*c* to memory array 315-*i*. First CA interface 310-*i* may be coupled with memory array 315-*i* regardless of whether selection component 325-*d* is in the channel A configuration, the channel AC configuration, or the channel ABCD configuration. As such, first CA interface 310-*i* may forward the command over internal channel 605-*c* regardless of what configuration selection component 325-*d* is in. Internal channel 605-*c* may correspond to internal channel 320-*d* in FIGS. 4A, 4B, and 4C. If selection component 325-*d* is in the channel ABCD configuration, the command may not be forwarded to memory array 315-*j*, 315-*k*, or 315-*l*, which may be due to multiplexers 610-*b*, 610-*d*, and 610-*e* isolating first CA interface 310-*i* from memory arrays 315-*j*, 315-*k*, and 315-*l*, respectively. If selection component 325-*d* is in the channel A or AC configuration, however, the command may be forwarded to memory array 315-*j* over internal channels 605-*c* and 635-*b*. Internal channels 605-*c* and 635-*b* in combination may correspond to internal channel 320-*h* in FIGS. 4B and 4C. If selection component 325-*d* is in the channel AC configuration, the command may not be forwarded to memory array 315-*k* or 315-*l*, which may be due to multiplexers 610-*d* and 610-*e* isolating first CA interface 310-*i* from memory arrays 315-*k* and 315-*l*, respectively. If selection component 325-*d* is in the channel A configuration, however, the command may be forwarded to memory array 315-*k* over internal channels 605-*c* and 640-*a* and may be forwarded to memory array 315-*l* over internal channels 605-*c* and 640-*b*. Internal channels 605-*c* and 640-*a* in combination may correspond to internal channel 320-*j* in FIG. 4C and internal channels 605-*c* and 640-*b* may correspond to internal channel 320-*k* in FIG. 4C.

In other examples, a command may be received by second CA interface 310-*j* over CA channel 186-*j*. Second CA interface 310-*j* may forward the command over internal channel 605-*d* to multiplexer 610-*b*. If the selection component 325-*d* is in the channel ABCD configuration, the command may be forwarded to the memory array 315-*j* over internal channels 605-*d* and 635-*b*. Internal channel 605-*d* in combination with internal channel 635-*b* may correspond to internal channel 320-*e* described with reference to FIG. 4A. If selection component 325-*d* is in the channel A or AC configuration, the command may not be forwarded to memory array 315-*j* (e.g., multiplexer 610-*h* may be isolating second CA interface 310-*j* from memory array 315-*j*).

In yet other examples, a command may be received by third. CA interface 310-*k* over CA channel 186-*k*, Third CA interface 310-*k* may forward the command over internal channel 605-*e* to multiplexer 610-*d*. Third CA interface 310-*k* may be coupled with multiplexer 610-*d* regardless of whether selection component 325-*d* is in the channel A configuration, the channel AC configuration, or the channel ABCD configuration. As such, third CA interface 310-*i* may forward the command over internal channel 605-*e* regardless of what configuration selection component 325-*d* is in. If selection component 325-*d* is in the channel A configuration, the command may be forwarded to multiplexer 610-*e*, but may not be forwarded to memory array 315-*k* or 315-*l*, which may be due to multiplexers 610-*d* and 610-*e*, respectively, isolating third CA interface 310-*k* from memory arrays 315-*k* and 315-*l*. If selection component 325-*d* is in the channel AC or ABCD configuration, the command may be forwarded to memory array 315-*k* over internal channels 605-*e* and 640-*a*. Internal channels 605-*e* and 640-*a* in combination may correspond to internal channel 320-*f* in FIGS. 4A and 4B. If selection component 325-*d* is in the channel AC configuration, the command may be forwarded to memory array 315-*l* over internal channels 605-*e*, 635-*c*, and 640-*b*. Internal channels 605-*e*, 635-*c*, and 640-*b* in combination may correspond to internal channel 320-*i* in FIG. 4B. If selection component 325-*d* is in the channel ABCD configuration, the command may not be forwarded to multiplexer 610-*e* and, by extension, may not be forwarded to memory array 315-*l*, which may be due to multiplexer 610-*c* isolating third CA interface 310-*k* from multiplexer 610-*e*.

Figure 7:
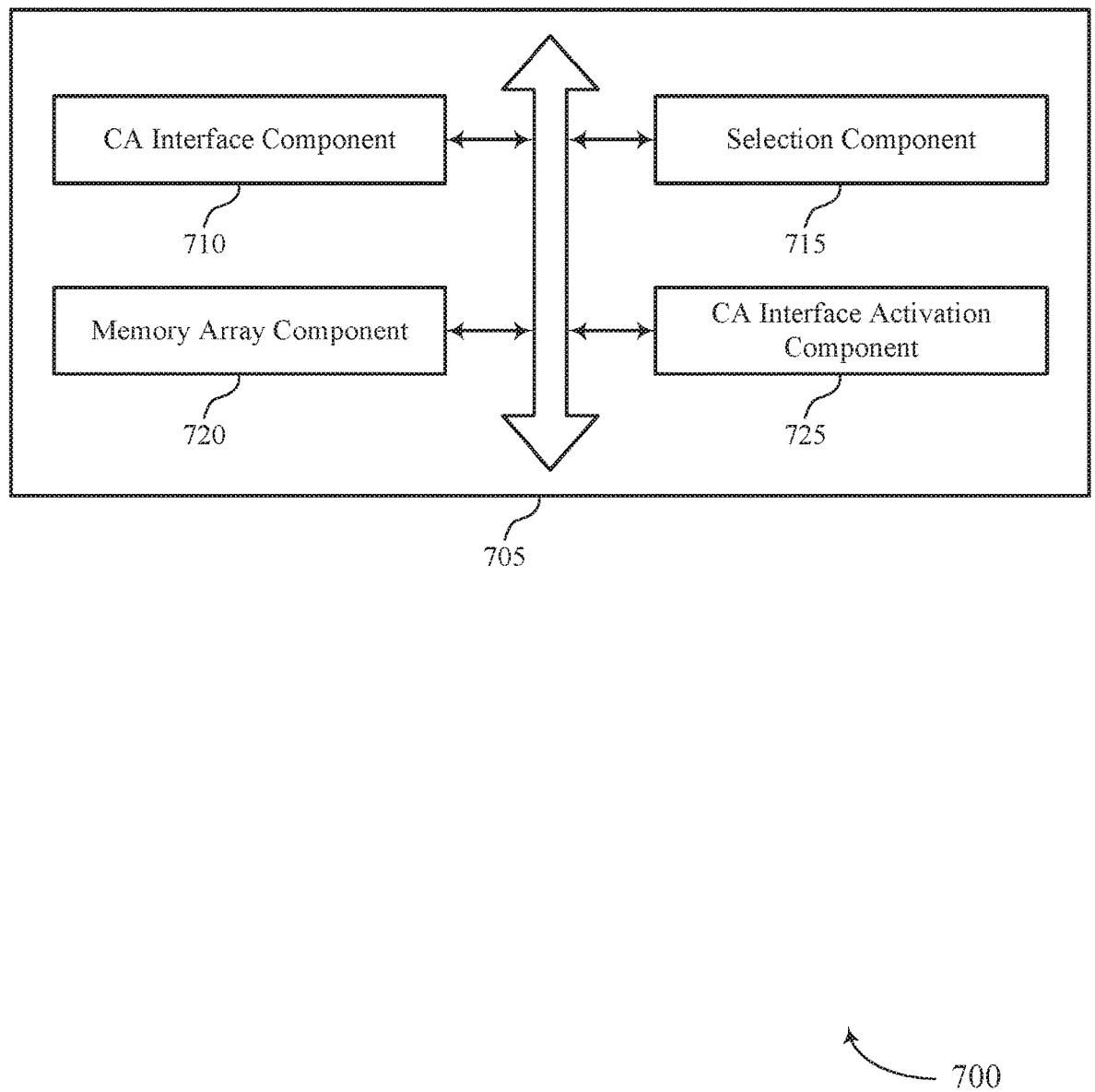
FIG. 7 shows a block diagram of a memory device that supports reconfigurable channel interfaces for memory devices in accordance with examples as disclosed herein.

In still other examples, a command may be received by fourth CA interface 310-*l* over CA channel 186-*l*. Fourth CA interface 310-*l* may forward the command over internal channel 605-*f* to multiplexer 610-*c*. If selection component 325-*d* is in the channel ABCD configuration, the command may be forwarded to the memory array 315-*l* over internal channels 605-*f*, 635-*c*, and 640-*b*. The combination of internal channels 605-*f*, 635-*c*, and 640-*b* may correspond to internal channel 320-*g* in FIG. 4A. If the selection component 325-*d* is in the channel A or AC configuration, the command may not be forwarded to memory array 315-*l* (e.g., multiplexer 610-*c* may be isolating fourth CA interface 310-*l* from multiplexer 610-*e*), FIG. 7 shows a block diagram 700 of a memory device 705 that supports reconfigurable channel interfaces for memory devices in accordance with examples as disclosed herein. The memory device 705 may be an example of aspects of a memory device as described with reference to FIGS. 1 through 6. The memory device 705 may include a CA interface component 710, a selection component 715, a memory array component 720, and a CA interface activation component 725. Each of these modules may communicate, directly or indirectly, with one another (e.g., via one or more buses).

The CA interface component 710 may receive, at a first command/address (CA) interface coupled with a first memory array, a command indicating a configuration of a set of CA interfaces including the first CA interface. In some examples, the CA interface component 710 may receive a read command at a command/address (CA) interface coupled with a first control channel, a first memory array, and a second memory array, the first memory array coupled with a first data channel and the second memory array coupled with a second data channel. In some examples, the CA interface component 710 may identify that the read command is for the second memory array. In some examples, the CA interface component 710 may receive, at the first CA interface based on coupling the first CA interface with the second memory array, a read command for the second memory array. In some examples, the CA interface component 710 may forward the read command from the first CA interface to the first memory array and the second memory array, where retrieving the data is based on forwarding the read command to the second memory array, and where retrieving the additional data is based on forwarding the read command to the first memory array. In some examples, the CA interface component 710 may receive, at the first CA interface, a second command for associating the second CA interface with the second memory array. In some examples, the CA interface component 710 may receive, over the first control channel, a write command at the CA interface. In some cases, the command is received after a memory device including the first CA interface has performed a boot-up process. In some cases, the command is received over one or more dedicated pins of the first CA interface as part of a boot-up process for a memory device including the first CA interface.

The selection component 715 may isolate a second CA interface of the set from a second memory array based on receiving the command. In some examples, the selection component 715 may couple the first CA interface with the second memory array based on isolating the second CA interface from the second memory array. In some examples, the selection component 715 may isolate the first CA interface from the second memory array based on receiving the second command. In some examples, the selection component 715 may couple the second CA interface with the second memory array based on isolating the first CA interface from the second memory array.

The memory array component 720 may retrieve a set of data from the second memory array based on receiving the read command. In some examples, the memory array component 720 may transmit the set of data over the second data channel based on retrieving the set of data from the second memory array. In some examples, the memory array component 720 may retrieve data from the second memory array based on receiving the read command at the first CA interface. In some examples, the memory array component 720 may retrieve additional data from the first memory array based on receiving the read command at the first CA interface. In some examples, the memory array component 720 may receive, over the second data channel, a second set of data based on receiving the write command at the CA interface. In some examples, the memory array component 720 may write the second set of data to the second memory array based on receiving the write command and the second set of data. In some examples, the memory array component 720 may retrieve a second set of data from the first memory array based on receiving the read command. In some examples, the memory array component 720 may transmit the second set of data over the first data channel based on retrieving the second set of data from the first memory array. In some examples, the memory array component 720 may retrieve a second set of data from a third memory array coupled with a third data channel based on receiving the read command at the CA interface. In some examples, the memory array component 720 may transmit the second set of data over the third data channel based on retrieving the second set of data from the third memory array.

The CA interface activation component 725 may deactivate the second CA interface based on receiving the command at the first CA interface, where coupling the first CA interface with the second memory array is based on deactivating the second CA interface. In some examples, the CA interface activation component 725 may deactivate a clock associated with the second CA interface based on receiving the command at the first CA interface. In some examples, the CA interface activation component 725 may activate the second CA interface based on receiving the second command at the first CA interface.

Figure 8:
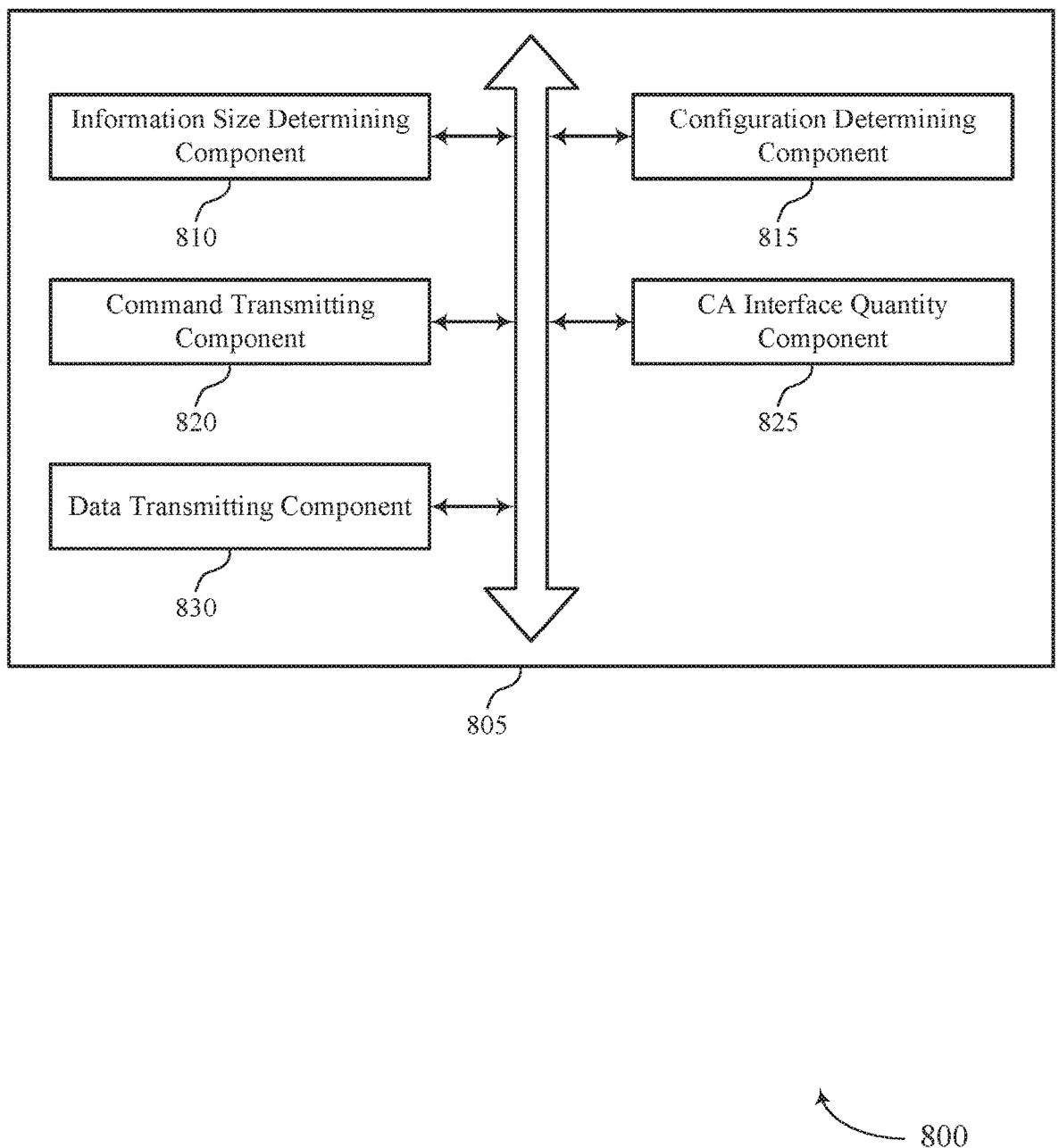
FIG. 8 shows a block diagram of a host device that supports reconfigurable channel interfaces for memory devices in accordance with examples as disclosed herein.

FIG. 8 shows a block diagram 800 of a host device 805 that supports reconfigurable channel interfaces for memory devices in accordance with examples as disclosed herein. The host device 805 may be an example of aspects of a host device as described with reference to FIGS. 1 and 3-5. The host device 805 may include an information size determining component 810, a configuration determining component 815, a command transmitting component 820, a CA interface quantity component 825, and a data transmitting component 830. Each of these modules may communicate, directly or indirectly, with one another (e.g., via one or more buses).

The information size determining component 810 may determine, by a host device, a size of information associated with an access command for performance by a memory device.

The configuration determining component 815 may determine a configuration of at least one of a set of command/address (CA) interfaces of the memory device based on determining the size of the information associated with the access command.

In some cases, the configuration indicates that the CA interface is coupled with a first memory array and a second memory array and that a second CA interface is deactivated.

The command transmitting component 820 may transmit, to a CA interface of the set, a command indicating the configuration.

The CA interface quantity component 825 may identify a quantity of reconfigurable CA interfaces of the memory device based on determining the size of the information associated with the access command, where determining the configuration is based on identifying the quantity of reconfigurable CA interfaces.

The data transmitting component 830 may transmit, over a data channel, data with the size based on transmitting the configuration to the memory device.

Figure 9:
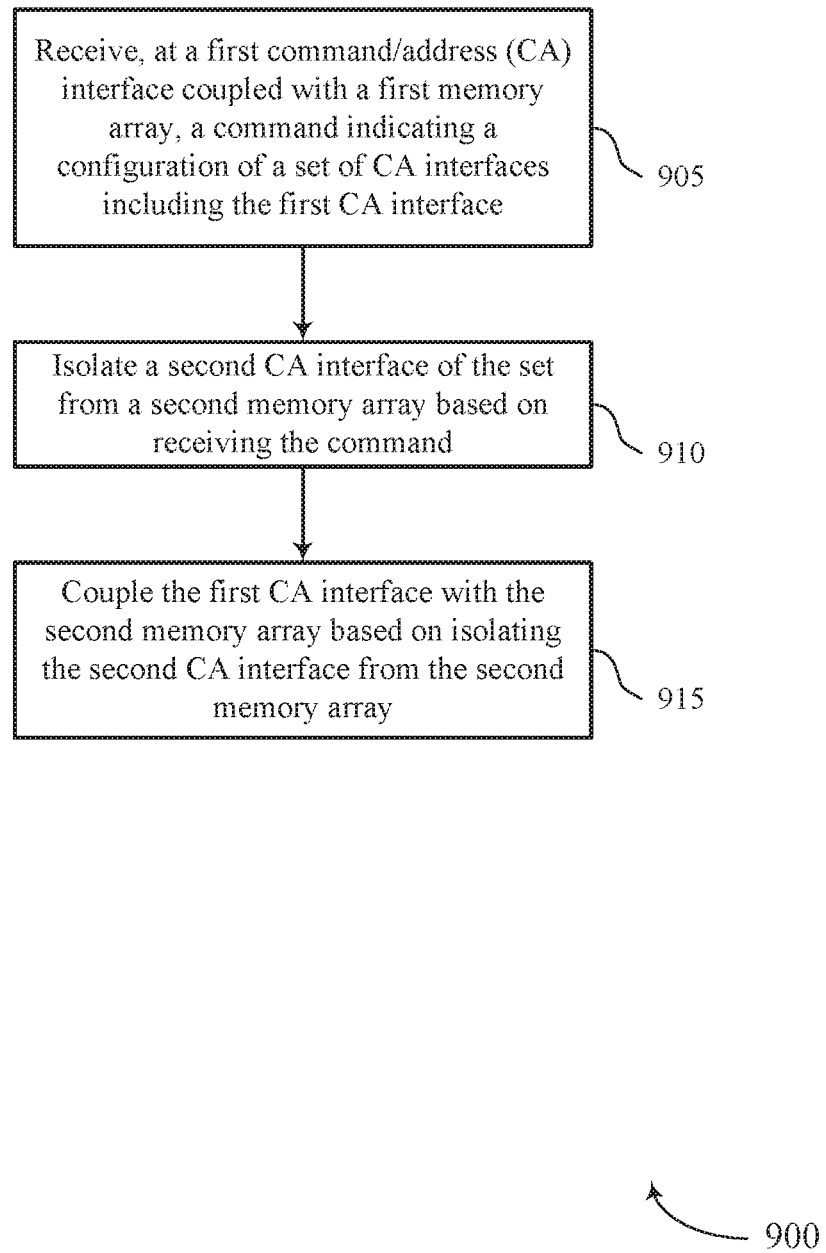
FIGS. 9 through 11 show flowcharts illustrating a method or methods that support reconfigurable channel interfaces for memory devices in accordance with examples as disclosed herein.

FIG. 9 shows a flowchart illustrating a method or methods 900 that supports reconfigurable channel interfaces for memory devices in accordance with examples as disclosed herein. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may receive, at a first CA interface coupled with a first memory array, a command indicating a configuration of a set of CA interfaces including the first CA interface. The operations of 905 may be performed according to the methods described herein. In some examples, aspects of the operations of 905 may be performed by a CA interface component as described with reference to FIG. 7.

At 910, the memory device may isolate a second CA interface of the set from a second memory array based on receiving the command. The operations of 910 may be performed according to the methods described herein. In some examples, aspects of the operations of 910 may be performed by a selection component as described with reference to FIG. 7.

At 915, the memory device may couple the first CA interface with the second memory array based on isolating the second CA interface from the second memory array. The operations of 915 may be performed according to the methods described herein. In some examples, aspects of the operations of 915 may be performed by a selection component as described with reference to FIG. 7.

In some examples, an apparatus as described herein may perform a method or methods, such as the method 900. The apparatus may include features, means, or instructions (e.g., a non-transitory computer-readable medium storing instructions executable by a processor) for receiving, at a first CA interface coupled with a first memory array, a command indicating a configuration of a set of CA interfaces including the first CA interface, isolating a second CA interface of the set from a second memory array based on receiving the command, and coupling the first CA interface with the second memory array based on isolating the second CA interface from the second memory array.

Some examples of the method 900 and the apparatus described herein may further include operations, features, means, or instructions for deactivating the second CA interface based on receiving the command at the first CA interface, where coupling the first CA interface with the second memory array may be based on deactivating the second CA interface.

In some examples of the method 900 and the apparatus described herein, deactivating the second CA interface may include operations, features, means, or instructions for deactivating a clock associated with the second CA interface based on receiving the command at the first CA interface.

Some examples of the method 900 and the apparatus described herein may further include operations, features, means, or instructions for receiving, at the first CA interface based on coupling the first CA interface with the second memory array, a read command for the second memory array, and retrieving data from the second memory array based on receiving the read command at the first CA interface.

Some examples of the method 900 and the apparatus described herein may further include operations, features, means, or instructions for retrieving additional data from the first memory array based on receiving the read command at the first CA interface.

Some examples of the method 900 and the apparatus described herein may further include operations, features, means, or instructions for forwarding the read command from the first CA interface to the first memory array and the second memory array, where retrieving the data may be based on forwarding the read command to the second memory array, and where retrieving the additional data may be based on forwarding the read command to the first memory array.

Some examples of the method 900 and the apparatus described herein may further include operations, features, means, or instructions for receiving, at the first CA interface, a second command for associating the second CA interface with the second memory array, isolating the first CA interface from the second memory array based on receiving the second command, and coupling the second CA interface with the second memory array based on isolating the first CA interface from the second memory array.

Some examples of the method 900 and the apparatus described herein may further include operations, features, means, or instructions for activating the second CA interface based on receiving the second command at the first CA interface.

In some examples of the method 900 and the apparatus described herein, the command may be received after a memory device including the first CA interface may have performed a boot-up process.

In some examples of the method 900 and the apparatus described herein, the command may be received over one or more dedicated pins of the first CA interface as part of a boot-up process for a memory device including the first CA interface.

Figure 10:
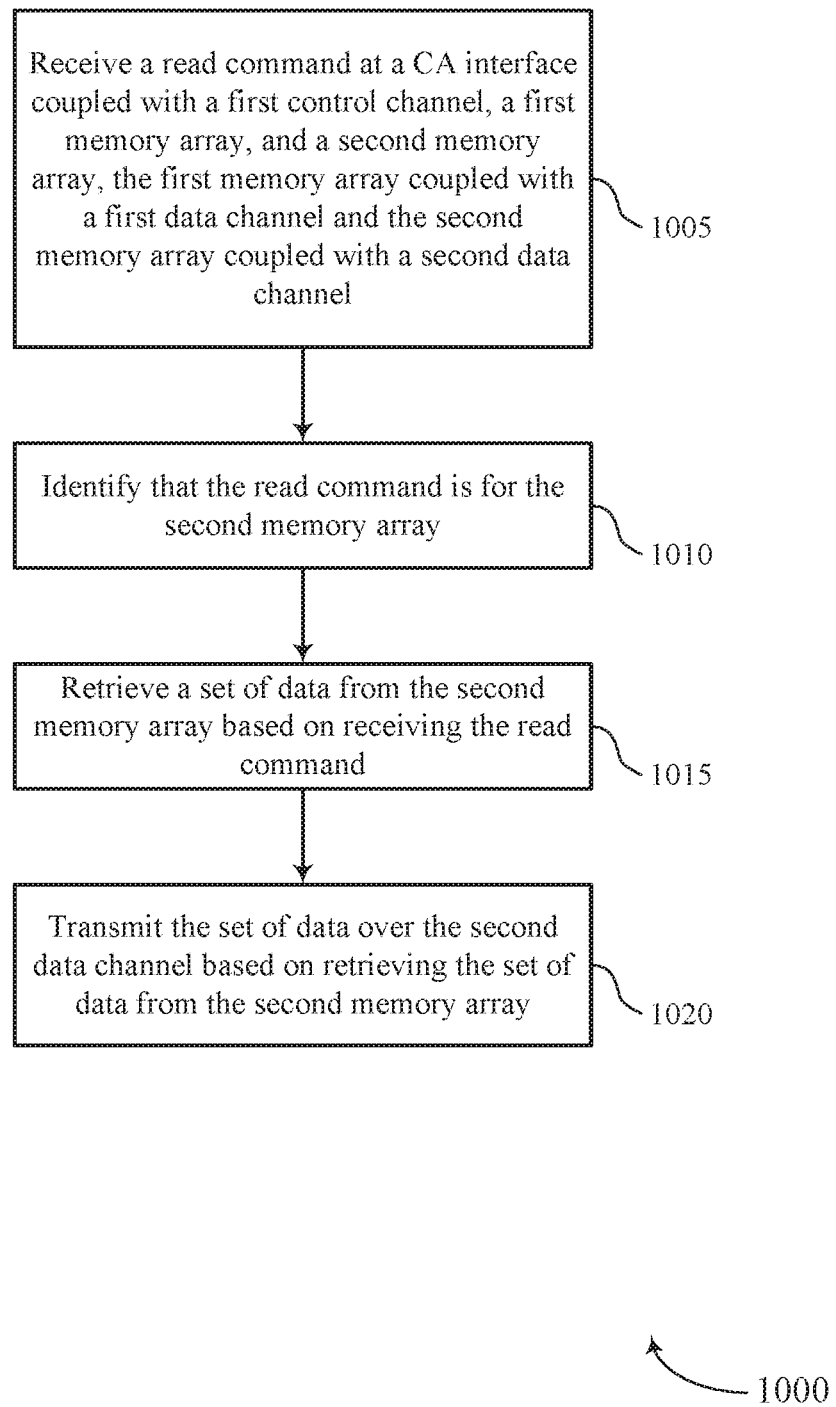

FIG. 10 shows a flowchart illustrating a method or methods 1000 that supports reconfigurable channel interfaces for memory devices in accordance with examples as disclosed herein. The operations of method 1000 may be implemented by a memory device or its components as described herein. For example, the operations of method 1000 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 1005, the memory device may receive a read command at a CA interface coupled with a first control channel, a first memory array, and a second memory array, the first memory array coupled with a first data channel and the second memory array coupled with a second data channel. The operations of 1005 may be performed according to the methods described herein. In some examples, aspects of the operations of 1005 may be performed by a CA interface component as described with reference to FIG. 7.

At 1010, the memory device may identify that the read command is for the second memory array. In some cases, the memory device may also identify that the read command is for the first memory array. The operations of 1010 may be performed according to the methods described herein. In some examples, aspects of the operations of 1010 may be performed by a CA interface component as described with reference to FIG. 7.

At 1015, the memory device may retrieve a set of data from the second memory array based on receiving the read command. In some cases, the memory device may retrieve an additional set of data from the first memory array based on receiving the read command. The operations of 1015 may be performed according to the methods described herein. In some examples, aspects of the operations of 1015 may be performed by a memory array component as described with reference to FIG. 7.

At 1020, the memory device may transmit the set of data over the second data channel based on retrieving the set of data from the second memory array. The operations of 1020 may be performed according to the methods described herein. In some examples, aspects of the operations of 1020 may be performed by a memory array component as described with reference to FIG. 7.

In some examples, an apparatus as described herein may perform a method or methods, such as the method 1000. The apparatus may include features, means, or instructions (e.g., a non-transitory computer-readable medium storing instructions executable by a processor) for receiving a read command at a CA interface coupled with a first control channel, a first memory array, and a second memory array, the first memory array coupled with a first data channel and the second memory array coupled with a second data channel, identifying that the read command is for the second memory array, retrieving a set of data from the second memory array based on receiving the read command, and transmitting the set of data over the second data channel based on retrieving the set of data from the second memory array.

Some examples of the method 1000 and the apparatus described herein may further include operations, features, means, or instructions for receiving, over the first control channel, a write command at the CA interface, receiving, over the second data channel, a second set of data based on receiving the write command at the CA interface, and writing the second set of data to the second memory array based on receiving the write command and the second set of data.

Some examples of the method 1000 and the apparatus described herein may further include operations, features, means, or instructions for retrieving a second set of data from the first memory array based on receiving the read command, and transmitting the second set of data over the first data channel based on retrieving the second set of data from the first memory array.

Some examples of the method 1000 and the apparatus described herein may further include operations, features, means, or instructions for retrieving a second set of data from a third memory array coupled with a third data channel based on receiving the read command at the CA interface, and transmitting the second set of data over the third data channel based on retrieving the second set of data from the third memory array.

Figure 11:
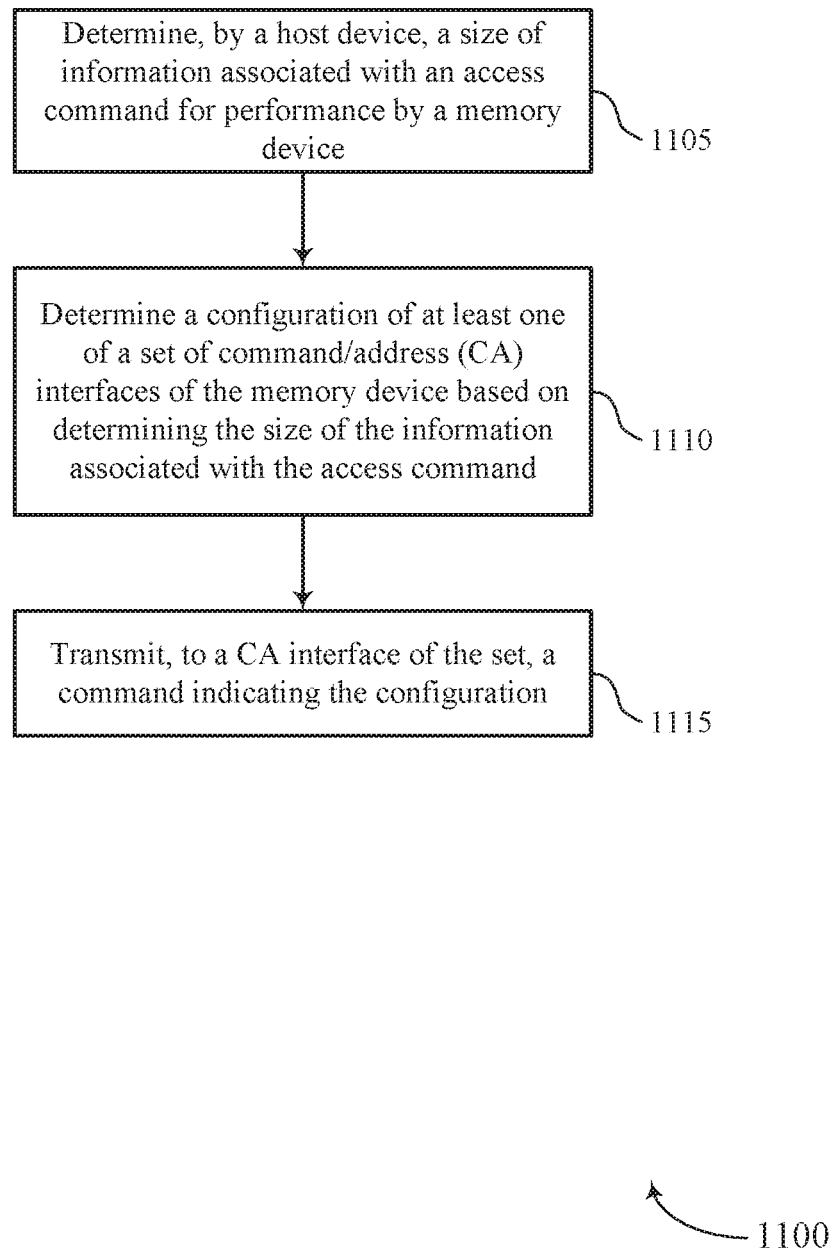

FIG. 11 shows a flowchart illustrating a method or methods 1100 that supports reconfigurable channel interfaces for memory devices in accordance with examples as disclosed herein. The operations of method 1100 may be implemented by a host device or its components as described herein. For example, the operations of method 1100 may be performed by a host device as described with reference to FIG. 8. In some examples, a host device may execute a set of instructions to control the functional elements of the host device to perform the described functions. Additionally or alternatively, a host device may perform aspects of the described functions using special-purpose hardware.

At 1105, the host device may determine, by a host device, a size of information associated with an access command for performance by a memory device. The operations of 1105 may be performed according to the methods described herein. In some examples, aspects of the operations of 1105 may be performed by an information size determining component as described with reference to FIG. 8.

At 1110, the host device may determine a configuration of at least one of a set of CA interfaces of the memory device based on determining the size of the information associated with the access command. The operations of 1110 may be performed according to the methods described herein. In some examples, aspects of the operations of 1110 may be performed by a configuration determining component as described with reference to FIG. 8.

At 1115, the host device may transmit, to a CA interface of the set, a command indicating the configuration. The operations of 1115 may be performed according to the methods described herein. In some examples, aspects of the operations of 1115 may be performed by a command transmitting component as described with reference to FIG. 8.

In some examples, an apparatus as described herein may perform a method or methods, such as the method 1100. The apparatus may include features, means, or instructions (e.g., a non-transitory computer-readable medium storing instructions executable by a processor) for determining, by a host device, a size of information associated with an access command for performance by a memory device, determining a configuration of at least one of a set of command/address (CA) interfaces of the memory device based on determining the size of the information associated with the access command, and transmitting to a CA interface of the set, a command indicating the configuration.

In some examples of the method 1100 and the apparatus described herein, the configuration indicates that the CA interface may be coupled with a first memory array and a second memory array and that a second CA interface may be deactivated.

Some examples of the method 1100 and the apparatus described herein may further include operations, features, means, or instructions for identifying a quantity of reconfigurable CA interfaces of the memory device based on determining the size of the information associated with the access command, where determining the configuration may be based on identifying the quantity of reconfigurable CA interfaces.

Some examples of the method 1100 and the apparatus described herein may further include operations, features, means, or instructions for transmitting, over a data channel, data with the size based on transmitting the configuration to the memory device.

It should be noted that the methods described above describe possible implementations, and that the operations and the steps may be rearranged or otherwise modified and that other implementations are possible. Further, portions from two or more of the methods may be combined.

An apparatus is described. The apparatus may include a first memory array coupled with a first data channel, a second memory array coupled with a second data channel, a first CA interface coupled with a first control channel and associated with the first memory array, a second CA interface coupled with a second control channel and associated with the second memory array, and a selection component coupled with the first CA interface and the second CA interface and configured to selectively couple the second memory array with the first CA interface at a first time and to selectively couple the second memory array with the second CA interface at a second time.

Some examples may further include commanding for the second memory array may be received over the first control channel based on the second memory array being coupled with the first CA interface.

Some examples of the apparatus may include a third memory array coupled with a third data channel, a fourth memory array coupled with a fourth data channel, a third CA interface coupled with a third control channel and associated with the third memory array, and a fourth CA interface coupled with a fourth control channel and associated with the fourth memory array, where the selection component may be coupled with the third CA interface and the fourth CA interface.

In some examples, the first CA interface may be coupled with the first memory array, the second memory array, the third memory array, and the fourth memory array using the selection component. In some examples, the selection component may be further configured to selectively couple the fourth memory array with the third CA interface or the fourth CA interface.

In some examples, the selection component may be further configured to selectively couple the third memory array with the first CA interface or the third CA interface and to selectively couple the fourth memory array with the first CA interface or the fourth CA interface. In some examples, the first memory array, the second memory array, the third memory array, and the fourth memory array or a combination thereof include DRAM memory cells.

In some examples, the selection component may include operations, features, means, or instructions for a multiplexer coupled with the first CA interface and the second CA interface. In some examples, the selection component further may include operations, features, means, or instructions for a latching component configured to transmit a selection signal to the multiplexer.

In some examples, the selection component further may include operations, features, means, or instructions for a second multiplexer coupled with a third CA interface and a fourth CA interface, where the third CA interface may be coupled with a third control channel and associated with a third memory array and the fourth CA interface may be coupled with a fourth control channel and associated with a fourth memory array, and where the latching component may be further configured to transmit the selection signal to the second multiplexer.

In some examples, the selection component further may include operations, features, means, or instructions for a third multiplexer coupled with the first CA interface and the third CA interface, a fourth multiplexer coupled with the first CA interface and the fourth CA interface, and a second latching component configured to transmit a second selection signal to the third multiplexer and the fourth multiplexer.

An apparatus is described. The apparatus may include a first memory array coupled with a first data channel and a second memory array coupled with a second data channel and a CA interface coupled with a first control channel, the first memory array, and the second memory array and configured to receive a write command and identify that the write command is for the second memory array, where the second memory array is configured to receive a set of data over the second data channel based on the CA interface receiving the write command and to write the set of data to the second memory array based on receiving the set of data.

In some examples, the CA interface may be configured to receive a read command and identify that the read command may be for the second memory array, and the second memory array may be configured to retrieve a second set of data based on the CA interface receiving the read command and to transmit the second set of data over the second data channel coupled with the second memory array based on the retrieving.

Some examples of the apparatus may include a second CA interface coupled with a second control channel and configured to be isolated from the second memory array when the CA interface receives the write command for the second memory array.

Some examples of the apparatus may include a third memory array coupled with a third data channel and configured to receive a third set of data over the third data channel based on the CA interface coupled with the first control channel receiving the write command and to write the third set of data to the third memory array based on receiving the third set of data, and a fourth memory array coupled with a fourth data channel and configured to receive a fourth set of data over the fourth data channel based on the CA interface coupled with the first control channel receiving the write command and to write the fourth set of data to the fourth memory array based on receiving the fourth set of data.

Some examples of the apparatus may include a third CA interface coupled with a third control channel and configured to be isolated from the third memory array when the CA interface coupled with the first control channel receives the write command, and a fourth CA interface coupled with a fourth control channel and configured to be isolated from the fourth memory array when the CA interface coupled with the first control channel receives the write command.

In some examples, the first memory array may be configured to receive a second set of data over the first data channel based on the CA interface coupled with the first control channel receiving the write command.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal, however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices described herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be 'off' or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving, at a first command/address (CA) interface coupled with a first memory array, a command indicating a configuration of a plurality of CA interfaces including the first CA interface, wherein each CA interface of the plurality of CA interfaces is coupled with a respective memory array of a plurality of memory arrays comprising at least the first memory array;
   isolating a second CA interface of the plurality from a second memory array of the plurality of memory arrays based at least in part on receiving the command; and
   coupling the first CA interface with the second memory array based at least in part on isolating the second CA interface from the second memory array, wherein the first CA interface is coupled with both the first memory array and the second memory array based at least in part on the configuration.

2. The method of claim 1, further comprising:
   deactivating the second CA interface based at least in part on receiving the command at the first CA interface, wherein coupling the first CA interface with the second memory array is based at least in part on deactivating the second CA interface.

3. The method of claim 2, wherein deactivating the second CA interface comprises:
   deactivating a clock associated with the second CA interface based at least in part on receiving the command at the first CA interface.

4. The method of claim 1, further comprising:
   receiving, at the first CA interface based at least in part on coupling the first CA interface with the second memory array, a read command for the second memory array; and
   retrieving data from the second memory array based at least in part on receiving the read command at the first CA interface.

5. The method of claim 4, further comprising:
   retrieving additional data from the first memory array based at least in part on receiving the read command at the first CA interface.

6. The method of claim 5, further comprising:
   forwarding the read command from the first CA interface to the first memory array and the second memory array, wherein retrieving the data is based at least in part on forwarding the read command to the second memory array, and wherein retrieving the additional data is based at least in part on forwarding the read command to the first memory array.

7. The method of claim 1, further comprising:
   receiving, at the first CA interface, a second command for associating the second CA interface with the second memory array;
   isolating the first CA interface from the second memory array based at least in part on receiving the second command; and
   coupling the second CA interface with the second memory array based at least in part on isolating the first CA interface from the second memory array.

8. The method of claim 7, further comprising:
   activating the second CA interface based at least in part on receiving the second command at the first CA interface.

9. The method of claim 1, wherein the command is received after a memory device comprising the first CA interface has performed a boot-up process.

10. The method of claim 1, wherein the command is received over one or more dedicated pins of the first CA interface as part of a boot-up process for a memory device comprising the first CA interface.

11. An apparatus, comprising:
a first memory array coupled with a first data channel, the first data channel configured to communicate first data between the first memory array and a memory controller;
a second memory array different than the first memory array and coupled with a second data channel, the second data channel configured to communicate second data between the second memory array and the memory controller;
a first command/address (CA) interface coupled with a first control channel and associated with the first memory array;
a second CA interface coupled with a second control channel and associated with the second memory array; and
a selection component coupled with the first CA interface and the second CA interface and configured to selectively couple the second memory array with the first CA interface at a first time and to selectively couple the second memory array with the second CA interface at a second time, wherein the first CA interface is coupled with the first memory array at the first time and the second time.

12. The apparatus of claim 11, wherein:
commands for the second memory array are received over the first control channel based at least in part on the second memory array being coupled with the first CA interface.

13. The apparatus of claim 11, further comprising:
a third memory array coupled with a third data channel;
a fourth memory array coupled with a fourth data channel;
a third CA interface coupled with a third control channel and associated with the third memory array; and
a fourth CA interface coupled with a fourth control channel and associated with the fourth memory array, wherein the selection component is coupled with the third CA interface and the fourth CA interface.

14. The apparatus of claim 13, wherein the first CA interface is coupled with the first memory array, the second memory array, the third memory array, and the fourth memory array using the selection component.

15. The apparatus of claim 13, wherein the selection component is further configured to selectively couple the fourth memory array with the third CA interface or the fourth CA interface.

16. The apparatus of claim 13, wherein the selection component is further configured to selectively couple the third memory array with the first CA interface or the third CA interface and to selectively couple the fourth memory array with the first CA interface or the fourth CA interface.

17. The apparatus of claim 13, wherein the first memory array, the second memory array, the third memory array, and the fourth memory array or a combination thereof comprise dynamic random access memory (DRAM) memory cells.

18. The apparatus of claim 11, wherein the selection component comprises a multiplexer coupled with the first CA interface and the second CA interface.

19. The apparatus of claim 18, wherein the selection component further comprises a latching component configured to transmit a selection signal to the multiplexer.

20. The apparatus of claim 19, wherein the selection component further comprises a second multiplexer coupled with a third CA interface and a fourth CA interface, wherein the third CA interface is coupled with a third control channel and associated with a third memory array and the fourth CA interface is coupled with a fourth control channel and associated with a fourth memory array, and wherein the latching component is further configured to transmit the selection signal to the second multiplexer.

21. The apparatus of claim 20, wherein the selection component further comprises:
a third multiplexer coupled with the first CA interface and the third CA interface;
a fourth multiplexer coupled with the first CA interface and the fourth CA interface; and
a second latching component configured to transmit a second selection signal to the third multiplexer and the fourth multiplexer.

22. A method, comprising:
receiving a read command at a command/address (CA) interface coupled with a first control channel, a first memory array, and a second memory array, the first memory array coupled with a first data channel and the second memory array coupled with a second data channel different than the first data channel;
identifying that the read command is for the second memory array;
retrieving a set of data from the second memory array based at least in part on receiving the read command; and
transmitting the set of data over the second data channel based at least in part on retrieving the set of data from the second memory array.

23. The method of claim 22, further comprising:
receiving, over the first control channel, a write command at the CA interface;
receiving, over the second data channel, a second set of data based at least in part on receiving the write command at the CA interface; and
writing the second set of data to the second memory array based at least in part on receiving the write command and the second set of data.

24. The method of claim 22, further comprising:
retrieving a second set of data from the first memory array based at least in part on receiving the read command; and
transmitting the second set of data over the first data channel based at least in part on retrieving the second set of data from the first memory array.

25. The method of claim 22, further comprising:
retrieving a second set of data from a third memory array coupled with a third data channel based at least in part on receiving the read command at the CA interface; and
transmitting the second set of data over the third data channel based at least in part on retrieving the second set of data from the third memory array.

26. An apparatus, comprising:
a first memory array coupled with a first data channel and a second memory array coupled with a second data channel; and
a command/address (CA) interface coupled with a first control channel, the first memory array, and the second memory array and configured to receive a write command and identify that the write command is for the second memory array, wherein:
the CA interface is configured to forward the write command to the second memory array over an internal channel; and
the second memory array is configured to receive a set of data over the second data channel based at least in part on the write command and to write the set of data to the second memory array based at least in part on receiving the set of data.

27. The apparatus of claim 26, wherein:
the CA interface is configured to receive a read command and identify that the read command is for the second memory array; and
the second memory array is configured to retrieve a second set of data based at least in part on the CA interface receiving the read command and to transmit the second set of data over the second data channel coupled with the second memory array based at least in part on the retrieving.

28. The apparatus of claim 26, further comprising:
a second CA interface coupled with a second control channel and configured to be isolated from the second memory array when the CA interface receives the write command for the second memory array.

29. The apparatus of claim 28, further comprising:
a third memory array coupled with a third data channel and configured to receive a third set of data over the third data channel based at least in part on the CA interface coupled with the first control channel receiving the write command and to write the third set of data to the third memory array based at least in part on receiving the third set of data; and
a fourth memory array coupled with a fourth data channel and configured to receive a fourth set of data over the fourth data channel based at least in part on the CA interface coupled with the first control channel receiving the write command and to write the fourth set of data to the fourth memory array based at least in part on receiving the fourth set of data.

30. The apparatus of claim 29, further comprising:
a third CA interface coupled with a third control channel and configured to be isolated from the third memory array when the CA interface coupled with the first control channel receives the write command; and
a fourth CA interface coupled with a fourth control channel and configured to be isolated from the fourth memory array when the CA interface coupled with the first control channel receives the write command.

31. The apparatus of claim 26, wherein the first memory array is configured to receive a second set of data over the first data channel based at least in part on the CA interface coupled with the first control channel receiving the write command.

32. A method, comprising:
determining, by a host device, a size of information associated with an access command for performance by a memory device;
determining a configuration of at least one of a plurality of command/address (CA) interfaces of the memory device based at least in part on determining the size of the information associated with the access command; and
transmitting, to a CA interface of the plurality, a command indicating the configuration.

33. The method of claim 32, wherein the configuration indicates that the CA interface is coupled with a first memory array and a second memory array and that a second CA interface is deactivated.

34. The method of claim 32, further comprising:
identifying a quantity of reconfigurable CA interfaces of the memory device based at least in part on determining the size of the information associated with the access command, wherein determining the configuration is based at least in part on identifying the quantity of reconfigurable CA interfaces.

35. The method of claim 32, further comprising:
transmitting, over a data channel, data with the size based at least in part on transmitting the configuration to the memory device.

\* \* \* \* \*